United States Patent
Jikutani

(10) Patent No.: US 7,466,738 B2
(45) Date of Patent: Dec. 16, 2008

(54) SURFACE EMITTING LASER DEVICE AND PRODUCTION METHOD

(75) Inventor: Naoto Jikutani, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 57 days.

(21) Appl. No.: 11/247,273

(22) Filed: Oct. 12, 2005

(65) Prior Publication Data

US 2006/0093006 A1    May 4, 2006

(30) Foreign Application Priority Data

Oct. 13, 2004  (JP)  ............................. 2004-299069
Sep. 20, 2005  (JP)  ............................. 2005-271375

(51) Int. Cl.
H01S 5/00 (2006.01)
(52) U.S. Cl. ............................. 372/50.124; 372/45.01; 372/46.01; 372/46.013; 372/46.015; 372/50.121
(58) Field of Classification Search ............. 372/45.01, 372/46.01, 46.013, 46.015, 50.121, 50.124, 372/99
See application file for complete search history.

(56) References Cited

U.S. PATENT DOCUMENTS

| | | | |
|---|---|---|---|
| 5,493,577 A * | 2/1996 | Choquette et al. ....... | 372/46.013 |
| 5,757,837 A * | 5/1998 | Lim et al. ................ | 372/50.21 |
| 6,207,973 B1 * | 3/2001 | Sato et al. ................ | 257/98 |
| 6,542,528 B1 | 4/2003 | Sato et al. | |
| 6,563,851 B1 | 5/2003 | Jikutani et al. | |
| 6,614,821 B1 | 9/2003 | Jikutani et al. | |
| 6,674,785 B2 | 1/2004 | Sato et al. | |
| 6,765,232 B2 | 7/2004 | Takahashi et al. | |
| 6,816,527 B2 * | 11/2004 | Ueki ....................... | 372/46.01 |
| 6,882,673 B1 * | 4/2005 | Wasserbauer et al. ...... | 372/50.1 |
| 2003/0198268 A1 * | 10/2003 | Jikutani et al. ............ | 372/46 |
| 2004/0065887 A1 * | 4/2004 | Sato et al. ................ | 257/79 |
| 2005/0040413 A1 * | 2/2005 | Takahashi et al. ......... | 257/96 |
| 2005/0047474 A1 * | 3/2005 | Johnson et al. ........... | 372/99 |
| 2005/0100068 A1 | 5/2005 | Jikutani et al. | |
| 2005/0147143 A1 | 7/2005 | Jikutani | |

FOREIGN PATENT DOCUMENTS

| | | |
|---|---|---|
| JP | 2002-208755 A | 7/2002 |
| JP | 2003-115634 A | 4/2003 |
| JP | 2004-23087 A | 1/2004 |
| JP | 2005-044964 A | 2/2005 |

* cited by examiner

Primary Examiner—Minsun Harvey
Assistant Examiner—Yuanda Zhang
(74) Attorney, Agent, or Firm—Dickstein Shapiro LLP

(57) ABSTRACT

A surface emitting laser device is disclosed that is able to selectively add a sufficiently large loss to a high order transverse mode so as to efficiently suppress a high order transverse mode oscillation and to oscillate at high output in a single fundamental transverse mode. The surface emitting laser device includes a first resonance region that includes an active layer and spacer layers, two distributed Bragg reflectors that sandwich the resonance region, and a current confinement structure that defines a current injection region for the active layer. At least one of the distributed Bragg reflectors includes a second resonance region arranged in the current injection region excluding a predetermined region surrounding a center of the current injection region.

23 Claims, 13 Drawing Sheets

SURFACE EMITTING LASER DEVICE AND PRODUCTION METHOD

BACKGROUND OF THE INVENTION

1. Field of the Invention

The present invention relates to a surface emitting laser device, a surface emitting laser array, a method of producing the surface emitting laser device, a surface emitting laser module, an electrophotographic system, an optical communication system, and an optical interconnection system.

2. Description of the Related Art

Because a surface emitting laser (for example, a surface emitting semiconductor laser) has a small-volume active layer and is capable of operations at a low threshold current and high speed modulation compared to an edge-emitting laser, it is attracting attention as a light source in a LAN (Local Area Network) or the like. In addition, since the surface emitting laser emits a laser beam in a direction perpendicular to a substrate thereof, it is easy to construct a two-dimensional array structure; thus, it is expected that the surface emitting laser is to be used as a light source for a parallel optical interconnection, or a writing light source array in a high-resolution electrophotographic system.

Because the surface emitting laser has a small-volume active layer, it can be operated at a low threshold compared to the edge-emitting laser. On the other hand, because of the small volume of the active layer, it is difficult for the surface emitting laser to obtain high output.

In addition, in applications such as optical fiber communications, a light source for an electrophotographic system, or others, laser oscillation in the single fundamental transverse mode is desirable, because such a mode results in a circular outgoing laser beam. However, it is difficult to maintain the oscillation in the single fundamental transverse mode even at high output.

Presently, there are two typical structures of the surface emitting laser, one is a so-called "selective oxidation structure", the other is a so-called "ion (hydrogen) implantation structure".

In a selective oxidation surface emitting laser device, oscillation in the single fundamental transverse mode is obtained by a well-known method of setting one side or the diameter of a non-oxidation region of a current-confinement structure, which is formed by selective oxidation of a semiconductor layer including aluminum, to be three or four times the oscillation wavelength. Since the selectively oxidized region has a refractive index lower than that of the semiconductor layer nearby, an effective refractive index waveguide structure is formed, and when one side or the diameter of the non-oxidation region is set as above, the refractive index waveguide structure satisfies the cut-off condition of high order transverse modes.

However, in this case, the relevant side or the diameter of the non-oxidation region is actually as small as 3 or a few more microns, so that the resistance of the current-confinement structure increases, and thereby the driving voltage of the laser device becomes high.

When the current injection region is small, the oscillation region becomes small. Further, heat generated in the laser device rises due to an increased resistance; as a result, it becomes difficult to obtain high output.

When actually driving the laser device, it is known that it is difficult to maintain the oscillation in the single fundamental transverse mode in a current highly-injected region because of the refractive index changes caused by heat generation in a current passage and plasma effect of injected carrier, gain saturation of the single fundamental transverse mode due to a spatial hole burning effect.

On the other hand, in a hydrogen ion implantation surface emitting laser device, in which a high resistance region formed by hydrogen ion implantation is provided inside the laser device for current confinement, the refractive index of the hydrogen ion implantation region barely changes, and transverse optical confinement is performed due to a difference of the refractive index caused by a temperature change during current conduction. Because this change of the refractive index is very small compared to that in the transverse optical confinement in the selective oxidation surface emitting laser device, it is possible to obtain operations in the single fundamental transverse mode even at a relatively large diameter of the current confinement. However, as is known, this kind device suffers from oscillation delay, or poor stability of the transverse mode.

As described above, it is difficult to obtain stable oscillation in the single fundamental transverse mode at high output with either the selective oxidation surface emitting laser device or the hydrogen ion implantation surface emitting laser device.

For example, Japanese Laid Open Patent Application No. 2003-115634 (hereinafter, referred to as "reference 1"), Japanese Laid Open Patent Application No. 2002-208755 (hereinafter, referred to as "reference 2"), and Japanese Laid Open Patent Application No. 2004-23087 (hereinafter, referred to as "reference 3") propose methods for solving the above problems to realize operations at high output in the single fundamental transverse mode particularly in the selective oxidation surface emitting laser device.

Specifically, in reference 1, focusing on the fact that the high order transverse modes have a mode distribution near the current injection region of a device, in a semiconductor layer forming a distributed Bragg reflector (DBR) on the surface of the laser device, a region corresponding to the high order transverse modes is etched, and a relief structure is provided on the surface of the laser device. Because of a change of phase conditions for multiple-reflection (that is, inversion of the phase conditions), reflectivity declines in the region where the distributed Bragg reflector is processed by etching, and it is possible to increase loss of the high order transverse modes. In other words, while a mode distribution exists in a region corresponding to the current injection region, without affecting the single fundamental transverse mode, it is attempted to obtain oscillation in the single fundamental transverse mode even at high output by adding the loss of the high order transverse modes.

In reference 2 and reference 3, based on an idea similar to reference 1, it is attempted to decrease the reflectivity of a distributed Bragg reflector near the current injection region by alloying a semiconductor contact layer on the surface of a device with a metal, and to obtain oscillation in the single fundamental transverse mode even at high output.

The above reference 1, reference 2, and reference 3 disclose methods of adjusting the reflectivity on the surface of the distributed Bragg reflector. However, because the distributed Bragg reflector utilizes multiple-reflections on interfaces of multiple layers, the light intensity is attenuated gradually towards the surface layer; thus, by arranging a reflectivity adjusting structure on the surface of the laser device, it is difficult to add a large mirror loss.

For this reason, in the related art, it is difficult to selectively add a sufficiently large mirror loss, and when the current is injected strongly, oscillation in the high order transverse modes is started. In other words, the high order transverse mode oscillation cannot be sufficiently suppressed.

SUMMARY OF THE INVENTION

It is a general object of the present invention to solve one or more of the problems of the related art.

A more specific object of the present invention is to provide a surface emitting laser device able to selectively add a sufficiently large loss to a high order transverse mode, to reliably suppress high order transverse mode oscillation, and to operate at high output in a single fundamental transverse mode; and a surface emitting laser array, a method of producing the surface emitting laser device, a surface emitting laser module, an electrophotographic system, an optical communication system, and an optical interconnection system.

According to a first aspect of the present invention, there is provided a surface emitting laser device, comprising: a first resonance region that includes an active layer and spacer layers provided on two sides of the active layer; two distributed Bragg reflectors that sandwich the resonance region and face each other, each of the distributed Bragg reflectors including periodically stacked low refractive index layers and high refractive index layers; and a current confinement structure that defines a current injection region for injecting a current into the active layer, wherein at least one of the distributed Bragg reflectors includes a second resonance region, and the second resonance region is arranged in the current injection region excluding a predetermined region surrounding the center of the current injection region.

As an embodiment, at least a part of the predetermined region, where the second resonance region is not provided, is within a boundary of the current injection region, and the second resonance region partially spatially overlaps the current injection region.

As an embodiment, the predetermined region, where the second resonance region is not provided, extends outside of a boundary of the current injection region.

As an embodiment, the second resonance region includes a spacer layer having a refractive index higher than the refractive index of the low refractive index layers in the distributed Bragg reflectors; and the spacer layer in the second resonance region has a thickness equaling m/2n of a laser oscillation wavelength, where, m is an integer, and n is the refractive index of the spacer layer in the second resonance region.

As an embodiment, the second resonance region includes a spacer layer having a refractive index lower than the refractive index of the high refractive index layers in the distributed Bragg reflectors; and the spacer layer in the second resonance region has a thickness equaling m/2n of a laser oscillation wavelength, where m is an integer and n is the refractive index of the spacer layer in the second resonance region.

As an embodiment, the current confinement structure includes a semiconductor layer selective oxidation structure including aluminum.

As an embodiment, the current confinement structure includes a high resistance region formed by ion implantation.

As an embodiment, one or more layer of the second resonance region includes a semiconductor material capable of absorbing laser oscillation light.

As an embodiment, a semiconductor layer capable of absorbing laser oscillation light is provided at a position corresponding to an anti-node of an electric field standing wave in the second resonance region. In the embodiment, the semiconductor layer includes a material having lattice strain.

As an embodiment, the current injection region has a shape different from the shape of the predetermined region, where the second resonance region is not provided; and the shape of the predetermined region is isotropic.

As an embodiment, the surface emitting laser device is configured to emit a laser beam from a light-emitting side opposite to a substrate thereof; and an electrode is provided on a surface of one of the distributed Bragg reflectors on the light-emitting side, said electrode having an opening within a boundary of a region occupied by the second resonance region.

As an embodiment, the surface emitting laser device is configured to emit a laser beam from a light-emitting side opposite to a substrate thereof; and an electrode is provided on a surface of one of the distributed Bragg reflectors on the light-emitting side, said electrode having an opening in a portion of the second resonance region on a side of a center of the surface emitting laser device.

As an embodiment, a position of the second resonance region is in a range from a position corresponding to approximately half of a number of pairs in one of the distributed Bragg reflectors including the second resonance region to a position on a side opposite to the active layer.

As an embodiment, more than one of the second resonance regions are provided.

As an embodiment, the active layer is formed from a III-V semiconductor material and has an oscillation wavelength longer than 1.1 μm, wherein the III element includes at least one of Ga and In, and the V element includes at least one of As, P, N, and Sb.

As an embodiment, the active layer is formed from a III-V semiconductor material and has an oscillation wavelength shorter than 1.1 μm, wherein the III element includes at least one of Al, Ga, and In, and the V element includes at least one of As and P.

As an embodiment, the predetermined region, where the second resonance region is not provided, is within a distance from the center of the current injection region with the distance being in a range from 0.5 μm to 2 μm.

According to a second aspect of the present invention, there is provided a surface emitting laser array, comprising a plurality of surface emitting laser devices, wherein each of the surface emitting laser devices includes: a first resonance region that includes an active layer and spacer layers provided on two sides of the active layer; two distributed Bragg reflectors that sandwich the resonance region and face each other, each of the distributed Bragg reflectors including periodically stacked low refractive index layers and high refractive index layers; and a current confinement structure that defines a current injection region for injecting a current into the active layer, wherein at least one of the distributed Bragg reflectors includes a second resonance region, and the second resonance region is arranged in the current injection region excluding a predetermined region surrounding a center of the current injection region.

According to a third aspect of the present invention, there is provided a method of producing a surface emitting laser device, said surface emitting laser device including: a first resonance region that has an active layer and spacer layers provided on two sides of the active layer; two distributed Bragg reflectors that sandwich the resonance region and face each other wherein each of the distributed Bragg reflector has periodically stacked low refractive index layers and high refractive index layers; and a current confinement structure that defines a current injection region for injecting a current into the active layer, wherein at least one of the distributed Bragg reflectors includes a second resonance region, and the second resonance region is arranged in the current injection region excluding a predetermined region surrounding a center of the current injection region, the second resonance region includes a spacer layer having a refractive index higher than the refractive index of the low refractive index layers in the distributed Bragg reflectors; and the spacer layer in the second resonance region has a thickness equaling m/2n of a laser oscillation wavelength, where, m is an integer, and n is the refractive index of the spacer layer in the second resonance region, said method comprising: a step of forming the second resonance region in at least one of the distributed Bragg reflectors, wherein the step of forming the second resonance region includes a first crystal growing step of forming a semiconductor layer for use of the spacer layer to a thickness greater than a predetermined thickness by ¼n of the laser oscillation wavelength; a step of etching and removing the semiconductor layer in the predetermined region, where the second resonance region is not provided; and a second crystal growing step of, after the step of etching and removing, forming another semiconductor layer having a thickness equaling ¼n of the laser oscillation wavelength.

According to a fourth aspect of the present invention, there is provided a method of producing a surface emitting laser array, said surface emitting laser array including: a first resonance region that has an active layer and spacer layers provided on two sides of the active layer; two distributed Bragg reflectors that sandwich the resonance region and face each other wherein each of the distributed Bragg reflectors has periodically stacked low refractive index layers and high refractive index layers; and a current confinement structure that defines a current injection region for injecting a current into the active layer, wherein at least one of the distributed Bragg reflectors includes a second resonance region, and the second resonance region is arranged in the current injection region excluding a predetermined region surrounding a center of the current injection region, the second resonance region includes a spacer layer having a refractive index higher than the refractive index of the low refractive index layers in the distributed Bragg reflectors; and the spacer layer in the second resonance region has a thickness equaling m/2n of a laser oscillation wavelength, where, m is an integer, and n is the refractive index of the spacer layer in the second resonance region, said method comprising: a step of forming the second resonance region in at least one of the distributed Bragg reflectors, wherein the step of forming the second resonance region includes the steps of: forming a semiconductor layer for use of the spacer layer having a predetermined thickness; etching and removing the semiconductor layer on the surface of the surface emitting laser device; and etching and removing the semiconductor layer in the predetermined region so as to have a thickness satisfying optical multiple-reflection conditions in the distributed Bragg reflectors.

As an embodiment, the step of etching and removing the semiconductor layer in the predetermined region is performed by a combination of dry etching and wet etching.

According to a fifth aspect of the present invention, there is provided a surface emitting laser module, comprising: a surface emitting laser device, wherein the surface emitting laser device includes: a first resonance region that includes an active layer and spacer layers provided on two sides of the active layer; two distributed Bragg reflectors that sandwich the resonance region and face each other, each of the distributed Bragg reflectors including periodically stacked low refractive index layers and high refractive index layers; and a current confinement structure that defines a current injection region for injecting a current into the active layer, wherein at least one of the distributed Bragg reflectors includes a second resonance region, and the second resonance region is arranged in the current injection region excluding a predetermined region surrounding a center of the current injection region.

According to a sixth aspect of the present invention, there is provided an electrophotographic system, comprising: a surface emitting laser device, wherein the surface emitting laser device includes: a first resonance region that includes an active layer and spacer layers provided on two sides of the active layer; two distributed Bragg reflectors that sandwich the resonance region and face each other, each of the distributed Bragg reflectors including periodically stacked low refractive index layers and high refractive index layers; and a current confinement structure that defines a current injection region for injecting a current into the active layer, wherein at least one of the distributed Bragg reflectors includes a second resonance region, and the second resonance region is arranged in the current injection region excluding a predetermined region surrounding a center of the current injection region.

According to a seventh aspect of the present invention, there is provided an optical communication system, comprising: a surface emitting laser device, wherein the surface emitting laser device includes: a first resonance region that includes an active layer and spacer layers provided on two sides of the active layer; two distributed Bragg reflectors that sandwich the resonance region and face each other, each of the distributed Bragg reflector including periodically stacked low refractive index layers and high refractive index layers; and a current confinement structure that defines a current injection region for injecting a current into the active layer, wherein at least one of the distributed Bragg reflectors includes a second resonance region, and the second resonance region is arranged in the current injection region excluding a predetermined region surrounding a center of the current injection region.

According to an eighth aspect of the present invention, there is provided an optical interconnection system, comprising: a surface emitting laser device, wherein the surface emitting laser device includes: a first resonance region that includes an active layer and spacer layers provided on two sides of the active layer; two distributed Bragg reflectors that sandwich the resonance region and face each other, each of the distributed Bragg reflectors including periodically stacked low refractive index layers and high refractive index layers; and a current confinement structure that defines a current injection region for injecting a current into the active layer, wherein at least one of the distributed Bragg reflectors includes a second resonance region, and the second resonance region is arranged in the current injection region excluding a predetermined region surrounding a center of the current injection region.

According to the surface emitting laser device of the present invention, the surface emitting laser device includes a first resonance region having an active layer and spacer layers provided on two sides of the active layer, two distributed Bragg reflectors that sandwich the resonance region and face each other with each of the distributed Bragg reflectors including periodically stacked low refractive index layers and high refractive index layers, and a current confinement structure that defines a current injection region for injecting a current into the active layer, and at least one of the distributed Bragg reflectors includes a second resonance region arranged in the current injection region excluding a predetermined region surrounding a center of the current injection region. For example, the center is that of a cross-section of the current injection region parallel to the substrate, and the predetermined region, where the second resonance region is not provided, is within a distance from the center, for example, the distance being 0.5 μm or more.

Because of laser oscillation in the second resonance region, compared to the related art, it is possible to selectively add a sufficiently large mirror loss to high order transverse modes; thereby, it is possible to highly efficiently suppress high order transverse mode oscillation. Since the high order transverse mode oscillation is suppressed, it is possible to provide a surface emitting laser device capable of operation at high output in a single fundamental transverse mode.

According to the surface emitting laser device of the present invention, because at least a part of the predetermined region, where the second resonance region is not provided, is within a boundary of the current injection region, and the second resonance region partially spatially overlaps the current injection region, and because the second resonance region is provided to overlap with the current injection region, it is possible to more efficiently reduce the higher order transverse modes, and the area of the current injection region can be set larger than in the related art, as a result, it is possible to prevent an increase of the resistance (in turn, an increase of the operating voltage), and an increase of heat generation, which particularly occur in a selective oxidation surface emitting laser device of the related art, and to realize operations at high output in the single fundamental transverse mode. Further, because of an increase of differential gain due to the decreased heat generation and an increase of a relaxed oscillation frequency due to the increased output of the fundamental transverse mode, it is possible to realize high speed modulation. In addition, even in an ion implantation surface emitting laser device, similarly, because it is possible to highly efficiently suppress high order transverse mode oscillation, it is possible to obtain stable oscillation at high output in the single fundamental transverse mode.

According to the surface emitting laser device of the present invention, because the predetermined region, where the second resonance region is not provided, extends out of a boundary of the current injection region, the influence on the fundamental transverse mode (that is, increase of loss) is suppressed to be small, and compared to the related art, it is possible to highly efficiently suppress high order transverse mode oscillation without increasing an oscillation threshold current of the fundamental transverse mode. Therefore, it is possible to obtain stable oscillation at high output in the single fundamental transverse mode.

According to the surface emitting laser device of the present invention, the second resonance region may include a spacer layer having a refractive index higher than the refractive index of the low refractive index layers in the distributed Bragg reflectors, and the spacer layer in the second resonance region has a thickness equaling m/2n of the laser oscillation wavelength (where m is an integer and n is the refractive index of the spacer layer in the second resonance region). Because of a strong resonance action in the second resonance region, it is possible to effectively add a sufficiently large mirror loss to the high order transverse modes, and thereby, it is possible to provide a surface emitting laser device capable of oscillation at high output in the single fundamental transverse mode.

According to the surface emitting laser device of the present invention, the second resonance region may include a spacer layer having a refractive index lower than the refractive index of the high refractive index layers in the distributed Bragg reflectors, and the spacer layer in the second resonance region has a thickness equaling m/2n of a laser oscillation wavelength (where m is an integer and n is the refractive index of the spacer layer in the second resonance region). Because of a strong resonance action in the second resonance region, it is possible to effectively add a sufficiently large mirror loss to the high order transverse modes, and thereby, it is possible to provide a surface emitting laser device capable of oscillation at high output in the single fundamental transverse mode.

According to the surface emitting laser device of the present invention, the current confinement structure may include a semiconductor layer selective oxidation structure including aluminum. In such a selective oxidation surface emitting laser device, due to the resonance action in the second resonance region, it is possible to highly efficiently suppress high order transverse mode oscillation, and thereby, it is possible to obtain oscillation in the single fundamental transverse mode in a current-highly-injected region.

Specifically, in a selective oxidation surface emitting laser device of the related art, when the current is strongly injected, the cut-off condition of high order transverse modes is not satisfied any longer because of a refractive index change due to the plasma effect and the heat generation, or the spatial hole burning, and the high order transverse mode oscillation starts. In contrast, in the present invention, due to the resonance action in the second resonance region, the high order transverse mode oscillation is suppressed highly efficiently, and thereby, oscillation in the single fundamental transverse mode is obtainable even in the current-highly-injected region.

According to the surface emitting laser device of the present invention, the current confinement structure may include a high resistance region formed by ion implantation. In such an ion implantation surface emitting laser device, due to the resonance action in the second resonance region, it is possible to highly efficiently suppress high order transverse mode oscillation, and as a result, it is possible to improve stability of the transverse mode and obtain stable oscillation in the fundamental transverse mode in a current-highly-injected region.

Specifically, in an ion implantation surface emitting laser device of the related art, compared to the selective oxidation surface emitting laser device, confinement of the transverse mode is weak, and the transverse mode is unstable with respect to the driving condition; thereby, it is difficult to obtain stable oscillation at high output in the single fundamental transverse mode. In contrast, in the present invention, due to the resonance action in the second resonance region, the high order transverse mode oscillation is suppressed highly efficiently, and thereby, stability of the transverse mode is improved, and stable oscillation in the single fundamental transverse mode is obtainable even in the current-highly-injected region.

According to the surface emitting laser device of the present invention, because one or more layers of the second resonance region may include a semiconductor material capable of absorbing laser oscillation light, it is possible to further add a large absorption loss in addition to the mirror loss. Due to this, in the second resonance region, the high order transverse mode having superposed mode distributions is much increased in a threshold gain required for inducing oscillation. Therefore, it is possible to highly efficiently suppress the high order transverse mode oscillation. In addition, because of optical absorption in the second resonance region, light passing through the second resonance region is effectively absorbed, so that the outgoing laser beam can be shaped to have any desired shape in response to the shape of the predetermined region without the second resonance region, in which the second resonance region is not provided.

According to the surface emitting laser device of-the present invention, because a semiconductor layer capable of absorbing laser oscillation light may be provided at a position corresponding to an anti-node of an electric field standing wave in the second resonance region, it is possible to further add a large absorption loss in addition to the mirror loss. Due to this, in the second resonance region, the high order transverse mode having superposed mode distributions is much increased in threshold gain required for inducing oscillation. Therefore, it is possible to highly efficiently suppress the high order transverse mode oscillation.

Because the semiconductor layer may include a material having lattice strain, it is possible to efficiently suppress higher order transverse mode oscillation in surface emitting laser devices having various oscillation wavelengths.

According to the surface emitting laser device of the present invention, because the current injection region has a shape different from a shape of the predetermined region, where the second resonance region is not provided, and the shape of the predetermined region is isotropic, even when a light emission pattern in the active region has an anisotropic shape, it is possible to obtain an outgoing beam having an isotropic shape.

According to the surface emitting laser device of the present invention, the surface emitting laser device is configured to emit a laser beam from a light-emitting side opposite to a substrate thereof, and an electrode is provided on a surface of one of the distributed Bragg reflectors on the light-emitting side, while the electrode has an opening within a boundary of a region occupied by the second resonance region. Therefore, influence on the fundamental transverse mode (that is, increase of loss) is suppressed to be small, and it is possible to provide a surface emitting laser device capable of operation at high output in a single fundamental transverse mode.

According to the surface emitting laser device of the present invention, the surface emitting laser device is configured to emit a laser beam from a light-emitting side opposite to a substrate thereof, and an electrode is provided on a surface of one of the distributed Bragg reflectors on the light-emitting side, while the electrode has an opening in a portion of the second resonance region on a side of a center of the surface emitting laser device. Therefore, it is possible to prevent reduction of the reflectivity caused by the electrode, to obtain high reflectivity, and to obtain a strong resonance action in the second resonance region.

According to the surface emitting laser device of the present invention, the position of the second resonance region is in a range from a position corresponding to approximately half of a number of pairs in one of the distributed Bragg reflectors including the second resonance region to a position on a side opposite to the active layer. Due to this, it is possible to obtain high resonance effect and efficiently suppress the high order transverse mode oscillation.

According to the surface emitting laser device of the present invention, because more than one second resonance regions are provided, it is possible to efficiently suppress the high order transverse mode oscillation.

According to the surface emitting laser device of the present invention, because the active layer is formed from a III-V semiconductor material and has an oscillation wavelength longer than 1.1 μm, wherein the III element includes at least one of Ga and In, and the V element includes at least one of As, P, N, and Sb, it is possible to add a large absorption loss in addition to the mirror loss at the long wavelength band, and to efficiently suppress the high order transverse mode oscillation.

According to the surface emitting laser device of the present invention, because the active layer is formed from a III-V semiconductor material and has an oscillation wavelength shorter than 1.1 μm, wherein the III element includes at least one of Al, Ga, and In, and the V element includes at least one of As and P, the resistance is low at the short wavelength band; hence, it is possible to provide a surface emitting laser device capable of oscillation at high output in the single fundamental transverse mode.

According to the surface emitting laser device of the present invention, because the predetermined region, where the second resonance region is not provided, is within a distance from the center of the current injection region with the distance being in a range from 0.5 μm to 2 μm, it is possible to provide a surface emitting laser device capable of oscillation at high output in the single fundamental transverse mode, and especially a short wavelength surface emitting laser device suitable for a write light source in a high resolution electrophotographic system.

According to the surface emitting laser array of the present invention which includes plural surface emitting laser devices as described above, it is possible to provide a surface emitting laser array capable of oscillation at high output in the single fundamental transverse mode, and suitable for application as a multi-beam write system in an electrophotographic system or a light source in an optical communication system. In addition, it is possible to provide a surface emitting laser array able to uniformly control the outgoing beams to have any desired shapes and sizes, thus being superior in beam uniformity inside the array.

According to the method of producing a surface emitting laser device of the present invention, the second resonance region is formed by two crystal growing steps, specifically, a first crystal growing step of forming a semiconductor layer for use of the spacer layer having a thickness greater than a predetermined thickness by ¼n of the laser oscillation wavelength, and a second crystal growing step of, after etching and removing the semiconductor layer in the predetermined region, forming another semiconductor layer having a thickness equaling ¼n of the laser oscillation wavelength. As a result, it is possible to easily form the second resonance region in a portion of the distributed Bragg reflector in the region where the second resonance region is not to be formed, with the phase conditions for multiple-reflection being satisfied. That is to say, according to the method of the present invention, it is possible to easily fabricate a surface emitting laser device capable of operation at high output in a single fundamental transverse mode.

According to the other method of producing a surface emitting laser device of the present invention, the second resonance region is formed by steps of forming a semiconductor layer for use of the spacer layer to a predetermined thickness, etching and removing the semiconductor layer on the surface of the surface emitting laser device, and etching and removing the semiconductor layer in the predetermined region, in which the second resonance region is not provided, so as to have a thickness satisfying optical multiple-reflection conditions in the distributed Bragg reflectors. As a result, it is possible to easily form the second resonance region when the second resonance region is provided near the surface of the distributed Bragg reflector. In other words, according to the other method of the present invention, it is possible to easily fabricate a surface emitting laser device capable of operation at high output in the single fundamental transverse mode.

In addition, because the step of etching and removing the semiconductor layer in the predetermined region is performed by a combination of dry etching and wet etching, it is possible to fabricate the second resonance region with a uniform shape and good reproducibility.

According to the surface emitting laser module of the present invention, which includes the surface emitting laser device as described above, or the above mentioned surface emitting laser array including plural of the surface emitting laser devices, it is possible to provide a surface emitting laser module capable of oscillation at high output in the fundamental transverse mode and capable of reliable coupling with an optical fiber, and able to suppress the high order mode oscillation. As a result, even when operating conditions (for example, output level) of the module change, the coupling condition and the optical input to the optical fiber barely change. In addition, because of a low resistance, high-speed operations can be realized. In other words, according to the present invention, it is possible to provide a surface emitting laser module of high reliability and capable of high-speed operation at high output in the single fundamental transverse mode.

According to the electrophotographic system of the present invention, which includes the surface emitting laser device as described above, or the above mentioned surface emitting laser array including plural of the surface emitting laser devices, if the surface emitting laser device or the surface emitting laser array is used as a write light source in the electrophotographic system, because the outgoing laser beam is circular, it is easy to shape the laser beam. In addition, when the surface emitting laser array is used, because of the high position precision between the lasers or laser arrays, multiple laser beams can be easily condensed by the same lens with good reproducibility. Thus, it is possible to provide a high speed electrophotographic system having a simple optical system, low cost and high resolution.

According to the optical communication system of the present invention, which includes the surface emitting laser device as described above, or the above mentioned surface emitting laser array including plural of the surface emitting laser devices, because the surface emitting laser device and the surface emitting laser array are capable of oscillation at high output in the fundamental transverse mode, it is possible to obtain reliable coupling with an optical fiber. In addition, because the high order mode oscillation is suppressed, the coupling condition and the optical input to the optical fiber barely change even when operating conditions (for example, output level) of the laser device or laser array change. In addition, because of a low resistance, high-speed operations can be realized. Further, because high output is obtainable compared to the related art, it is possible to realize long distance communications. In other words, according to the present invention, it is possible to provide an optical communication system of high reliability and stable coupling with the optical fiber and capable of high speed communications.

According to the optical interconnection system of the present invention, which includes the surface emitting laser device as described above, or the above mentioned surface emitting laser array including plural of the surface emitting laser devices, because the surface emitting laser device and the surface emitting laser array are capable of oscillation at high output in the fundamental transverse mode, it is possible to obtain reliable coupling with an optical fiber. In addition, because the high order mode oscillation is suppressed, the coupling condition and the optical input to the optical fiber barely change even when operating conditions (for example, output level) of the laser device or laser array change. In addition, because of a low resistance, high-speed operations can be realized. In other words, according to the present invention, it is possible to provide an optical interconnection system of high reliability and stable coupling with the optical fiber and capable of high speed transmission.

These and other objects, features, and advantages of the present invention will become more apparent from the following detailed description of preferred embodiments given with reference to the accompanying drawings.

DESCRIPTION OF THE PREFERRED EMBODIMENTS

Below, preferred embodiments of the present invention are explained with reference to the accompanying drawings.

First Embodiment

The present embodiment discloses a surface emitting laser device which includes a first resonance region that has an active layer and spacer layers on two sides of the active layer, two distributed Bragg reflectors that sandwich the resonance region and face each other with each of the distributed Bragg reflectors having periodically stacked low refractive index layers and high refractive index layers, and a current confinement structure that defines a current injection region for injecting a current into the active layer. In the surface emitting laser device, at least one of the distributed Bragg reflectors includes a second resonance region, which is arranged in the current injection region excluding a predetermined region surrounding the center of the current injection region. For example, the center is that of a cross-section of the current injection region parallel to the substrate, for example, when the cross-section of the current injection region is a circle, a four-sided shape, or a triangle, it is the center of the circle, the four-sided shape, or the triangle, respectively. In addition, for example, the predetermined region, where the second resonance region is not provided, is within a distance of about 0.5 μm or more from the center (refer to FIG. 4 through FIG. 6).

In other words, in the present embodiment, similar to a surface emitting laser device of the related art, the distributed Bragg reflectors are provided primarily in the current injection region corresponding to the fundamental transverse mode, with each of the distributed Bragg reflectors having a periodic stack structure of the low refractive index layers and the high refractive index layers. In addition, the second resonance region is provided in the middle of one of the distributed Bragg reflectors in an area of the current injection region excluding a region within a distance (for example, about 0.5 μm or more) from the center of the current injection region. The excluded region primarily corresponds to a high order transverse mode distribution.

Figure 1:
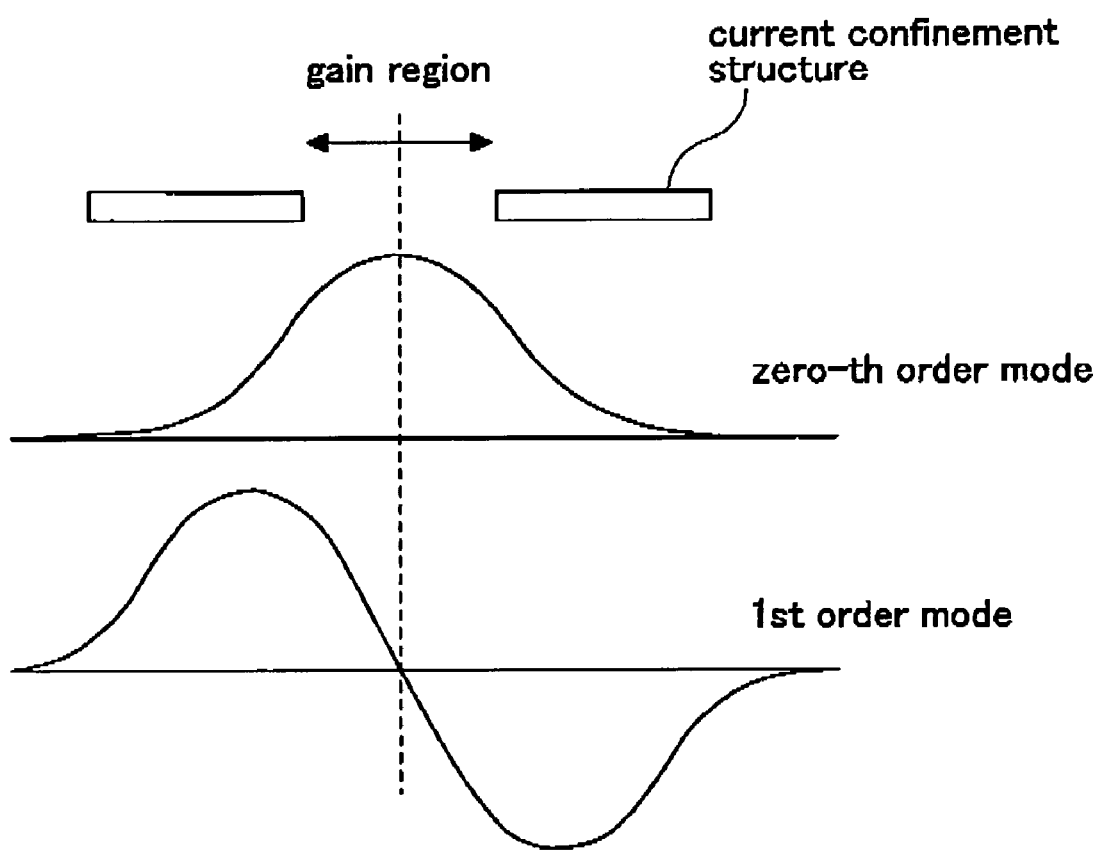
FIG. 1 schematically illustrates position dependence of electric field strength distributions of a fundamental transverse mode and a high order transverse mode.

FIG. 1 schematically illustrates position dependence of electric field strength distributions of the fundamental transverse mode (that is, zero-th order) and a high order transverse mode (for example, 1st order), where the abscissa represents position and the ordinate represents electric field strength.

As illustrated in FIG. 1, it is well known that the fundamental transverse mode in the surface emitting laser device possesses a single-peak mode distribution in which a peak appears in a gain region corresponding to the current injection region. Meanwhile, in the mode distribution of the high order transverse modes in the surface emitting laser device, peaks appear in areas deviating from the center of the current injection region.

In the present embodiment, the second resonance region is provided in an area of the current injection region related to the high order transverse modes. In the area having the second resonance region, due to the resonance action of laser oscillation light in the second resonance region, the electric field strength in the second resonance region and the surrounding area can be increased. Along with this, light intensity in the area of the distributed Bragg reflector having the second resonance region is increased globally, and thereby, light intensity output from the surface of laser device is also increased. This indicates that the reflectivity of the distributed Bragg reflector is equivalently decreased, corresponding to an increase of the mirror-induced loss (mirror loss). Hence, for a resonance mode through the second resonance region, the oscillation threshold gain increases further.

On the other hand, in the area without the second resonance region (primarily consider the area corresponding to the current injection region), because the resonance action as described above does not occur, due to multiple reflections caused by the distributed Bragg reflectors, the electric field strength decreases continuously toward the surface of the laser device, and thereby, the mirror loss is reduced. In other words, the high order transverse modes having mode distributions in the area without the second resonance region require a high gain for inducing oscillation, so that the oscillation is suppressed.

Figure 2:
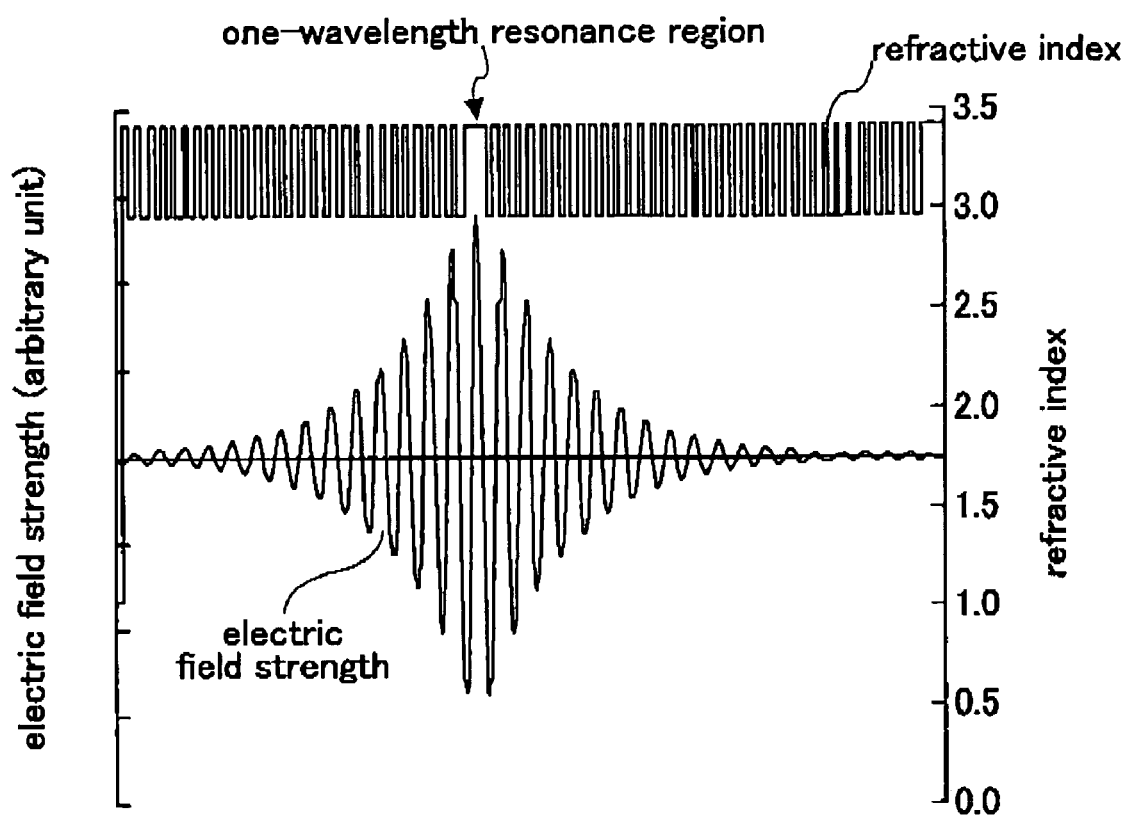
FIG. 2 exemplifies an electric field strength distribution and a refractive index distribution inside a one-dimensional surface emitting laser device for illustrating a resonance action in the present invention.

FIG. 2 exemplifies an electric field strength distribution and a refractive index distribution inside a one-dimensional surface emitting laser device formed from a semiconductor material and having an oscillation wavelength of 1.3 μm for illustrating the resonance action in the present embodiment.

Figure 3:
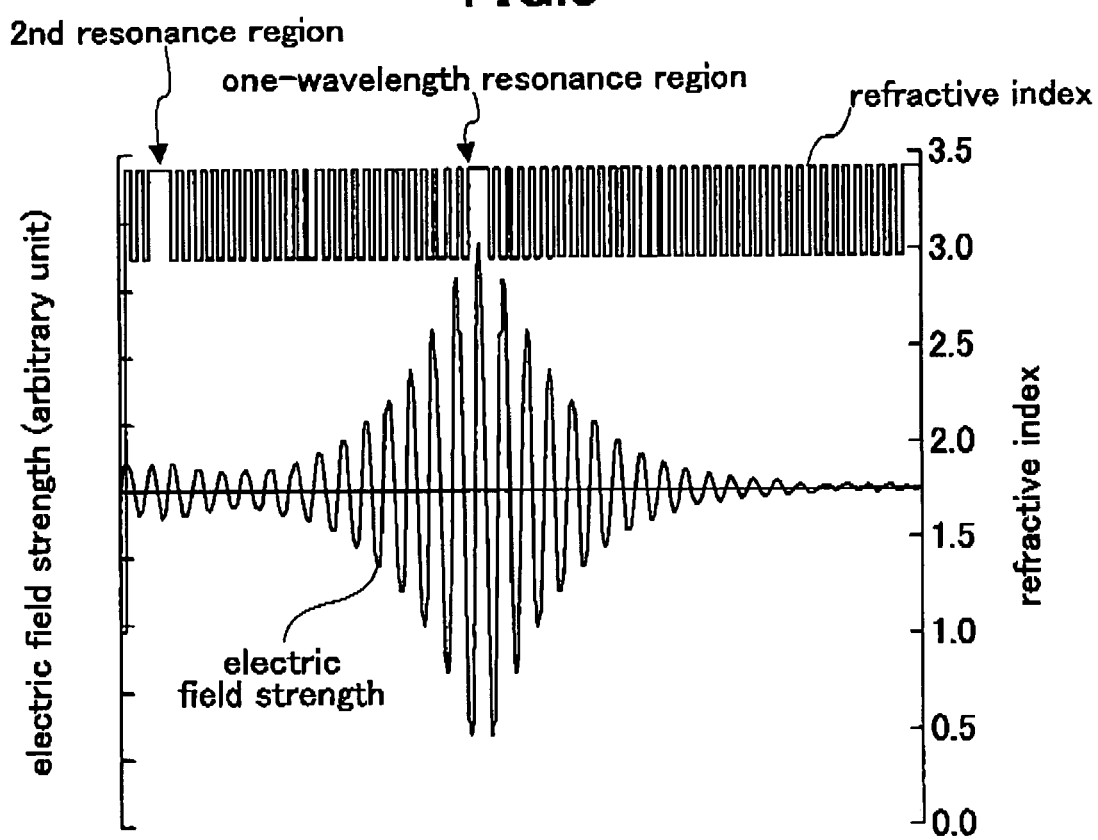
FIG. 3 exemplifies an electric field strength distribution and a refractive index distribution inside a one-dimensional surface emitting laser device having a second resonance region, for illustrating the resonance action in the present invention.

FIG. 3 exemplifies an electric field strength distribution and a refractive index distribution inside a one-dimensional surface emitting laser device similar to that shown in FIG. 2 but having a second resonance region, also for illustrating the resonance action in the present embodiment.

In FIG. 2 and FIG. 3, the abscissa represents position in the surface emitting laser device structure, the ordinate on the right side represents the rear side (a GaAs substrate) of the surface emitting laser device structure, and the ordinate on the left side represents the front side (an air layer) of the surface emitting laser device structure. In addition, a laser beam is emitted from the air layer side having low reflectivity.

In FIG. 2, the surface emitting laser device structure includes a 35-pair lower distributed Bragg reflector formed from $Al_{0.9}Ga_{0.1}As/GaAs$, a one-wavelength resonance region, and a 26-pair upper distributed Bragg reflector formed from $Al_{0.9}Ga_{0.1}As/GaAs$. A gain region is at the center of the one-wavelength resonance region.

Similar to the surface emitting laser device structure in FIG. 2, the surface emitting laser device structure in FIG. 3 also includes a one-wavelength resonance region, near the center of which there is a gain region. In the surface emitting laser device structure in FIG. 3, a second resonance region is provided at a position in the middle of the distributed Bragg reflector corresponding to the third pair from the surface of the air layer. For example, the second resonance region is formed from a GaAs layer corresponding to one laser oscillation wavelength.

In FIG. 2, the electric field strength in the surface emitting laser device structure is a maximum at the resonance region near the center, and decreases continuously toward the rear side (the substrate side) and the front side (the air layer side).

In contrast, in FIG. 3, due to the resonance action of the second resonance region arranged near the air layer side, the electric field strength on the air layer side is higher than that on the substrate side. Because of light seeping out of the second resonance region, the electric field strength in the distributed Bragg reflector on the air layer side is enhanced globally, thereby, light intensity output from the air layer side is also increased. This indicates that the reflectivity of the distributed Bragg reflector is equivalently decreased. This phenomenon can be understood as a resonance between the resonance region including the gain region and the second resonance region. For example, a similar phenomenon occurs in the case of electrons, which is known as "resonance tunneling".

As described above, because the reflectivity declines due to the resonance action in the second resonance region, the mirror loss increases, and the gain required for inducing oscillation rises.

For example, in the surface emitting laser device structure in FIG. 3, the reflectivity declines due to the resonance action in the second resonance region, the mirror loss increases, and the gain required for inducing oscillation rises. Specifically, in the surface emitting laser device structure in FIG. 3, the gain required for inducing oscillation (oscillation threshold gain) is estimated to be 24 times the oscillation threshold gain in the surface emitting laser device structure in FIG. 2. When the high refractive index layer at the second pair from the surface of the air layer in the surface emitting laser device structure in FIG. 3 is used as the second resonance region, the oscillation threshold gain is increased to be about 16 times the oscillation threshold gain in the surface emitting laser device structure in FIG. 2. In comparison, for example, assuming a high refractive index layer on the surface has a thickness equaling ½n of the laser oscillation wavelength (where n is the refractive index of the high refractive index layer), when the phase conditions for multiple-reflection are inverted, it is estimated that the oscillation threshold gain is increased nine times. Compared to this case, the increase obtained with the structure in FIG. 3 is very large.

Therefore, in the present embodiment, when the second resonance region is provided in an area at the middle of the distributed Bragg reflector corresponding to the high order transverse modes, due to the resonance action in the second resonance region, it is possible to highly efficiently increase the mirror loss for the high order transverse mode oscillation. As a result, it is possible to efficiently suppress the high order transverse mode oscillation, thus obtaining a surface emitting laser device capable of oscillation at high output in the single fundamental transverse mode.

In this way, when the second resonance region is provided, due to the resonance action in the second resonance region, it is possible to greatly increase the threshold gain required for inducing laser oscillation. As a result, when the second resonance region is provided only in the area corresponding to the high order transverse modes, it is possible to selectively increase the laser oscillation threshold gain required by the high order transverse modes; hence, it is possible to highly efficiently suppress the high order transverse mode laser oscillation, thus obtaining a surface emitting laser device capable of oscillation at high output in the single fundamental transverse mode.

In the above example, the second resonance region is provided at a position relatively far from the resonance region including the gain region, for example, at a position near the surface on the light outgoing side. However, it is apparent from the above descriptions (and as described below) that a high oscillation threshold gain can be obtained even when the second resonance region is provided at a position near the resonance region including the gain region.

If the second resonance region and the resonance region including the gain region are far from each other, coupling (or resonance) between the second resonance region and the resonance region including the gain region becomes weak, and this deceases the number of pairs in the distributed Bragg reflector including the second resonance region (in FIG. 3, the number of pairs of the distributed Bragg reflector on the light outgoing side), and thus, the resonance action becomes weak.

Therefore, it is preferable that the second resonance region be at an appropriate distance from the resonance region including the gain region. In doing so, the resonance action becomes strong, the electric field strength is increased in the distributed Bragg reflector including the second resonance region and on the surface on the light outgoing side, and as a result, the oscillation threshold gain is increased.

On the other hand, if the second resonance region and the resonance region including the gain region are very close to each other, the coupling between the second resonance region and the resonance region including the gain region is too strong, and inducing an increase of the number of pairs in the distributed Bragg reflector between the second resonance region and the surface on the light outgoing side increases, in turn inducing high reflectivity. As a result, the laser oscillation resonance in the second resonance region is greatly attenuated until arriving at the surface, and the oscillation threshold gain becomes small again, making it difficult to suppress the high order transverse mode oscillation.

Therefore, it is preferable that the second resonance region be provided in the distributed Bragg reflector including the second resonance region within a range from a position corresponding to about half of the number of pairs in the distributed Bragg reflector to a position on the opposite side of the active layer, in other words, from the position corresponding to about half of the pair number of the distributed Bragg reflector to the position of the surface on the light outgoing side of the distributed Bragg reflector. Especially, when the second resonance region is provided at a position corresponding to about half of the pair number of the distributed Bragg reflector, strong resonance effect can be obtained, and the high order transverse mode oscillation can be suppressed efficiently.

In order to suppress the high order transverse mode oscillation and obtain large single fundamental transverse mode output, it is necessary to provide the second resonance region in a region excluding an area where the electric field strength of the fundamental transverse mode is strong (that is, the region within a certain distance from the center of the current injection region), so that the second resonance region does not impose significant influence (loss) on the fundamental transverse mode.

In the surface emitting laser device, the width of the fundamental transverse mode distribution is dependent on strength of optical confinement of the transverse mode, but this width is primarily determined by the area of the current injection region, which serves as a gain region. Thus, the optimum size of the region without the second resonance region, that is, the region where the second resonance region is not provided, is also dependent on the area of the current injection region. Hence, it is necessary to set the optimum size of the region without the second resonance region in accordance with the area of the current injection region. Generally, in a device having a small current injection region, the area of the current injection region is small.

However, in an oxidation confinement surface emitting laser device, when the area of the current injection region is small, it is known that the diffraction loss of laser oscillation light with the selective oxidation structure, which defines the current injection region, increases, and the oscillation threshold current increases. Empirically, it is known that oscillation for practical use is obtainable when the laser device has a current injection region with a side or diameter thereof being about 1 μm, but if the side or the diameter of the current injection region is shorter than 1 μm, it is difficult to obtain oscillation for practical use. Thus, it is reasonable to consider that the lower limit of the length of the side or the diameter of the current injection region is 1 μm in practical use.

As described above, since the fundamental transverse mode distribution approximately corresponds to the size of the current injection region, and the length of a side or the diameter of the region without the second resonance region, which is able to selectively add a sufficiently large mirror loss to the high order transverse modes only, is greater than 1 μm, the region without the second resonance region should be within a distance of 0.5 μm or more from the center of the current injection region. Nevertheless, from the view of high output operation, it is desirable that the area of the current injection region be large.

Therefore, when the size of the region without the second resonance region is set according to the area of the current injection region in the above-mentioned region within a distance from the center of the current injection region under the condition that the region without the second resonance region does not significantly spatially overlap with the fundamental transverse mode, it is possible to efficiently suppress the high order transverse modes exclusively, and obtain oscillation at high output in the single fundamental transverse mode.

According to the present embodiment, the second resonance region is provided in the region corresponding to the high order transverse modes; thereby, it is possible to selectively increase the mirror loss for the high order transverse modes, and it is possible to increase the oscillation threshold gain for the high order transverse modes. As a result, it is possible to highly efficiently suppress the high order transverse mode oscillation, and to provide a surface emitting laser device capable of oscillation at high output in the single fundamental transverse mode.

Second Embodiment

The present embodiment discloses a surface emitting laser device which has a structure similar to that in the first embodiment. In addition, in the surface emitting laser device of the present embodiment, at least part of the range within a distance from the center of the current injection region is within a boundary of the current injection region, and the second resonance region partially spatially overlaps with the current injection region.

In the surface emitting laser device of the present embodiment, as described previously, because the second resonance region is provided in an area at the middle of the distributed Bragg reflector corresponding to the high order transverse modes, and because of the resonance action in the second resonance region, it is possible to highly efficiently increase the mirror loss for the high order transverse mode oscillation, and as a result, it is possible to efficiently suppress the high order transverse mode oscillation. Therefore, for the purpose of reducing the resistance, with the area of the current injection region being significantly large compared to that in the related art, it is possible to suppress the high order transverse mode oscillation by utilizing the resonance action in the second resonance region, and to obtain oscillation at high output in the single fundamental transverse mode.

However, with the area of the current injection region (that is, the area of the non-oxidized conductive region in the selective oxidation structure) being increased, confinement action of the high order transverse mode in the selective oxidation structure is enhanced, and due to this, spatial overlapping between the high order transverse mode distribution and the current injection region is large.

In this situation, if a portion of the second resonance region is arranged within the boundary of the current injection region, which is defined by the current confinement structure, with parts of the second resonance region spatially overlapping with the current injection region, it is possible to suppress the high order transverse mode oscillation efficiently.

In the selective oxidation surface emitting laser device, when the area of the current injection region is increased significantly to reduce the resistance, the confinement action of the high order transverse mode in the selective oxidation structure is enhanced, and the spatial overlapping between the high order transverse mode distribution and the current injection region is large. In the present embodiment, with parts of the second resonance region spatially overlapping with the current injection region, it is possible to suppress the high order transverse mode oscillation efficiently.

Therefore, it is possible to prevent an increase of the resistance (in turn, an increase of the operating voltage), and an increase of heat generation, which particularly occur in the selective oxidation surface emitting laser device of the related art, and to realize operations at high output in the single fundamental transverse mode. Further, because of an increase of a differential gain due to the decreased heat generation and an increase of a relaxed oscillation frequency due to the increased output of the fundamental transverse mode, it is possible to realize high speed modulation. In addition, even in an ion implantation surface emitting laser device, similarly, because it is possible to highly efficiently suppress high order transverse mode oscillation, it is possible to obtain stable oscillation at high output in the single fundamental transverse mode.

As described above, in the present embodiment, because at least part of the range within a distance from the center of the current injection region is within the boundary of the current injection region, and the second resonance region partially spatially overlaps with the current injection region, it is possible to prevent an increase of the resistance (in turn, an increase of the operation voltage) and an increase of heat generation, which particularly occur in the selective oxidation surface emitting laser device of the related art, and to realize operations at high output in the single fundamental transverse mode. Further, because of an increase of a differential gain due to the decreased heat generation and an increase of a relaxed oscillation frequency due to the increased output of the fundamental transverse mode, it is possible to realize high speed modulation.

In addition, even in an ion implantation surface emitting laser device, since the confinement action of the transverse mode becomes weak, it is easy to obtain the single fundamental transverse mode operation even in a relatively large current injection region; with the second resonance region partially spatially overlapping with the current injection region, similar to the present embodiment, it is possible to efficiently suppress the high order transverse mode oscillation, and to obtain stable oscillation at high output in the single fundamental transverse mode.

In the present embodiment, for example, the shape of the cross section of the current injection region parallel to the substrate is a circle, a four-sided shape, or a triangle, and the center of the current injection region mentioned here is the center of the cross section of the current injection region parallel to the substrate. The area without the second resonance region, which is within a distance from the center of the current injection region, may have a shape dependent on the cross section of the current injection region, for example, a circle, a four-sided shape, or a triangle, or any shape not dependent on the cross section of the current injection region.

Figure 4:
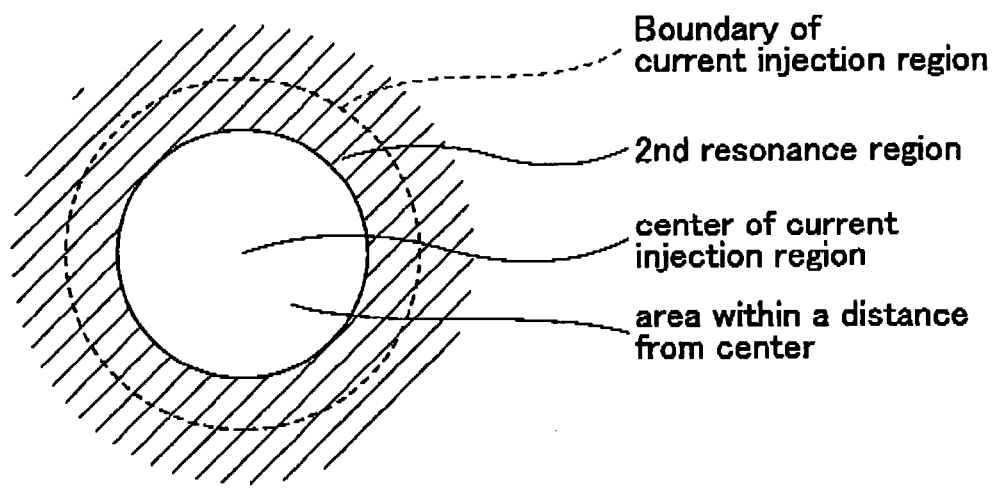
FIG. 4 is a schematic view illustrating an example of the area without the second resonance region in an embodiment of the present invention.

FIG. 4 is a schematic view illustrating an example of the area without the second resonance region in the present embodiment.

As illustrated in FIG. 4, the current injection region has a circular shape, and the area without the second resonance region also has a circular shape. In addition, as shown in FIG. 4, the whole area without the second resonance region is within the boundary of the current injection region, which is defined by the current confinement structure.

Figure 5:
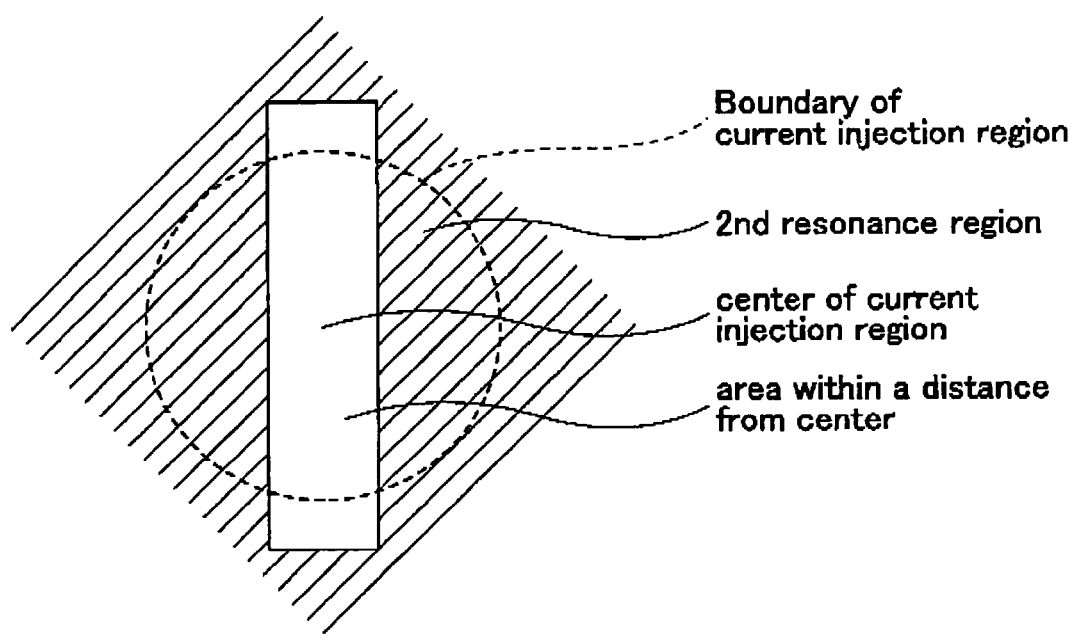
FIG. 5 is a schematic view illustrating another example of the area without the second resonance region in an embodiment of the present invention.

FIG. 5 is a schematic view illustrating another example of the area without the second resonance region in the present embodiment.

As illustrated in FIG. 5, the current injection region has a circular shape, but the area without the second resonance region has a rectangular shape. In addition, as shown in FIG. 5, a part of the area without the second resonance region is within the boundary of the current injection region, which is defined by the current confinement structure.

Third Embodiment

The present embodiment discloses a surface emitting laser device which has a structure similar to that in the first embodiment. In addition, in the surface emitting laser device of the present embodiment, the region without the second resonance region extends out of a boundary of the current injection region, which is defined by the current confinement structure.

In the surface emitting laser device of the present embodiment, as described previously, because the second resonance region is provided in an area at the middle of the distributed Bragg reflector corresponding to the high order transverse modes, and because of the resonance action in the second resonance region, it is possible to highly efficiently increase the mirror loss for the high order transverse mode oscillation, and thus to efficiently suppress the high order transverse mode oscillation.

Because the width of the fundamental transverse mode distribution approximately corresponds to the size of the current injection region, when the position of the second resonance region is out of the boundary of the current injection region, the spatial overlapping between the fundamental transverse mode distribution and the second resonance region is small. Due to this, influence on the fundamental transverse mode (that is, increase of loss) is suppressed to be small, and compared to the related art, it is possible to obtain an efficient surface emitting laser device with a low oscillation threshold current for the fundamental transverse mode. This is applicable to the selective oxidation surface emitting laser device and the ion implantation surface emitting laser device.

In the present embodiment, the shape of the cross section of the current injection region parallel to the substrate may be a circle, a four-sided shape, a triangle, or any other shape, and the center of the current injection region mentioned here is the center of the cross section of the current injection region parallel to the substrate. The area without the second resonance region, which is within a distance from the center of the current injection region, may have a shape dependent on the cross section of the current injection region, for example, a circle, a four-sided shape, or a triangle, or any shape not dependent on the cross section of the current injection region.

Figure 6:
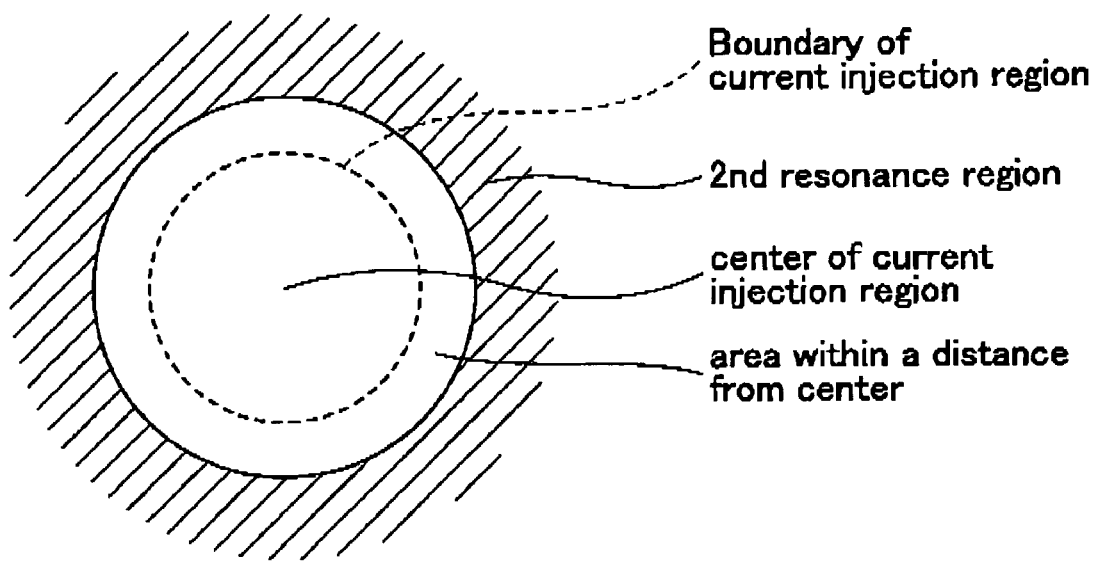
FIG. 6 is a schematic view illustrating an example of the area within a distance from the center of the cross section of the current injection region in an embodiment of the present invention.

FIG. 6 is a schematic view illustrating an example of the area within a distance from the center of the cross section of the current injection region in the present embodiment.

As illustrated in FIG. 6, the current injection region is circular, and the area without the second resonance region is also circular. In addition, as shown in FIG. 6, the area without the second resonance region extends out of the boundary of the current injection region, which is defined by the current confinement structure.

Fourth Embodiment

The present embodiment discloses a surface emitting laser device which has a structure basically the same as that in any one of the first, second, and third embodiments. In addition, in the surface emitting laser device of the present embodiment, the second resonance region may include a spacer layer having a refractive index higher than the refractive index of the low refractive index layers in the distributed Bragg reflector, and the spacer layer in the second resonance region has a thickness equaling m/2n of the laser oscillation wavelength, where m is an integer and n is the refractive index of the spacer layer in the second resonance region.

When the second resonance region is formed from a spacer layer having a high refractive index, as described above, in order to produce a laser beam efficiently by oscillation, it is necessary for the spacer layer in the second resonance region to have a thickness equaling m/2n of the laser oscillation wavelength, where m is an integer and n is the refractive index of the spacer layer in the second resonance region.

In addition, when the thickness of the spacer layer having a high refractive index is a multiple of half of the oscillation wavelength in the spacer layer, the phase condition for resonance is satisfied, and an electric field standing wave is generated whose anti-node is at the interface between the spacer layer constituting the second resonance region and the distributed Bragg reflector, strong resonance effect can be obtained. Because of the strong resonance action in the second resonance region, it is possible to effectively suppress the high order transverse modes, and to provide a surface emitting laser device capable of oscillation at high output in the single fundamental transverse mode.

According to the present embodiment, the second resonance region includes a spacer layer having a refractive index higher than the refractive index of the low refractive index layers in the distributed Bragg reflectors, and the spacer layer in the second resonance region has a thickness equaling m/2n of the laser oscillation wavelength (where m is an integer and n is the refractive index of the spacer layer in the second resonance region). Because of the strong resonance action in the second resonance region, it is possible to effectively add a sufficiently large mirror loss to the high order transverse modes, and thereby, it is possible to provide a surface emitting laser device capable of oscillation at high output in the single fundamental transverse mode.

Fifth Embodiment

The present embodiment discloses a surface emitting laser device which has a structure basically the same as that in any one of the first, second, and, third embodiments. In addition, in the surface emitting laser device of the present embodiment, the second resonance region may include a spacer layer having a refractive index lower than the refractive index of the high refractive index layers in the distributed Bragg reflector, and the spacer layer in the second resonance region has a thickness equaling m/2n of the laser oscillation wavelength, where m is an integer and n is the refractive index of the spacer layer in the second resonance region.

When the second resonance region is formed from a spacer layer having a low refractive index, as described above, in order to produce a laser beam efficiently by oscillation, it is necessary for the spacer layer in the second resonance region to have a thickness equaling $m/2n$ of the laser oscillation wavelength, where m is an integer and n is the refractive index of the spacer layer in the second resonance region.

In addition, because the thickness of the spacer layer having a high refractive index is a multiple of half of the oscillation wavelength in the spacer layer, the phase condition for resonance is satisfied, and an electric field standing wave is generated, whose anti-node is at the interface between the spacer layer constituting the second resonance region and the distributed Bragg reflector, and strong resonance effect can be obtained. Because of the strong resonance action in the second resonance region, it is possible to effectively suppress the high order transverse modes.

According to the present embodiment, the second resonance region includes a spacer layer having a refractive index lower than the refractive index of the high refractive index layers in the distributed Bragg reflectors, and the spacer layer in the second resonance region has a thickness equaling $m/2n$ of a laser oscillation wavelength (where m is an integer and n is the refractive index of the spacer layer in the second resonance region). Because of the strong resonance action in the second resonance region, it is possible to effectively add a sufficiently large mirror loss to the high order transverse modes, and thereby, it is possible to provide a surface emitting laser device capable of oscillation at high output in the single fundamental transverse mode.

Sixth Embodiment

The present embodiment discloses a surface emitting laser device which has a structure basically the same as that in any one of the first through fifth embodiments. In addition, in the surface emitting laser device of the present embodiment, the current confinement structure may have a semiconductor layer selective oxidation structure including aluminum.

In a selective oxidation surface emitting laser device of the related art, in order to satisfy the cut-off condition for the high order transverse modes, the single fundamental transverse mode control is attained by using the selective oxidation structure to limit the current injection region to a small region. However, when actually driving the laser device, it is difficult to maintain the cut-off condition to be satisfied because of the change of the refractive index due to the plasma effect of the injected carriers and heat generation in a current passage, or a spatial hole burning effect due to increased output of the fundamental transverse mode; as a result, the high order transverse mode oscillation is triggered.

In contrast, in the present embodiment, because the second resonance region is provided at the middle of the distributed Bragg reflector in an area excluding a region within a distance from the center of the current injection region (that is, an area corresponding to the high order transverse modes), and because of the resonance action in the second resonance region, as described previously, it is possible to highly efficiently increase the mirror loss for the high order transverse mode oscillation, and thus to efficiently suppress the high order transverse mode oscillation. Thus, it is possible to extend the operating point of starting the high order transverse mode oscillation to a current-highly-injected region.

That is, in the surface emitting laser device of the present embodiment, due to the resonance action in the second resonance region, the high order transverse mode oscillation is suppressed highly efficiently; thereby, oscillation in the single fundamental transverse mode is obtainable even in the current-highly-injected region.

In addition, in the present embodiment, because the high order transverse mode oscillation is suppressed efficiently due to the resonance action in the second resonance region, even when the area of the current injection region, which is defined by the selective oxidation structure, is set relatively large compared to the related art, the single fundamental transverse mode oscillation is obtainable. Hence, it is possible to reduce heat generation and resistance of the device, and to obtain high output.

According to surface emitting laser device of the present embodiment, it is possible to efficiently suppress high order transverse mode oscillation, and obtain oscillation in the single fundamental transverse mode at high output.

Seventh Embodiment

The present embodiment discloses a surface emitting laser device which has a structure basically the same as that in any one of the first through fifth embodiments. In addition, in the surface emitting laser device of the present embodiment, the current confinement structure may include a high resistance region formed by ion implantation.

In an ion implantation surface emitting laser device of the related art, compared to the selective oxidation surface emitting laser device, confinement action of the transverse mode is weak, and the transverse mode is unstable with respect to the driving condition; thereby, it is difficult to obtain stable oscillation at high output in the single fundamental transverse mode.

In contrast, in the present invention, because the second resonance region is provided at the middle of the distributed Bragg reflector in an area excluding a region within a distance from the center of the current injection region (that is, an area corresponding to the high order transverse modes), and because of the resonance action in the second resonance region, as described previously, the high order transverse mode oscillation is suppressed highly efficiently, thereby, stability of the transverse mode is improved, and stable oscillation in the single fundamental transverse mode is obtainable even in the current-highly-injected region.

According to the ion implantation surface emitting laser device of the present embodiment, it is possible to efficiently suppress the high order transverse mode oscillation, to improve stability of the transverse mode, and to obtain stable oscillation in the fundamental transverse mode in a current-highly-injected region at high output.

Eighth Embodiment

The present embodiment discloses a surface emitting laser device which has a structure basically the same as that in any one of the first through seventh embodiments. In addition, in the surface emitting laser device of the present embodiment, one or more layers of the second resonance region may be formed of a semiconductor material capable of absorbing laser oscillation light.

Due to the resonance action of the laser oscillation light in the second resonance region, the electric field strength increases in the second resonance region and surrounding the second resonance region. In addition, because the strength of the optical absorption action is proportional to light intensity (that is, electric field strength), if one or more layers of the second resonance region are formed from a semiconductor material capable of absorbing the laser oscillation light, it is possible to absorb a large quantity of light. In other words, with one or more layers of the second resonance region being formed from a light-absorbing semiconductor material, in the area where the second resonance region is provided, it is possible to further add a large absorption loss in addition to the above-mentioned mirror loss. Due to this, for the resonance mode through the second resonance region, the oscillation threshold gain increases further, and this enables more efficient suppression of the high order transverse mode oscillation.

In addition, because the second resonance region includes light-absorbing layers, the outgoing laser beam can be shaped to have any desired shape. In other words, due to the light-absorbing layers in the second resonance region, light passing through the second resonance region is effectively absorbed. Thus, the outgoing laser beam can be shaped to have any desired shape in response to the shape of the region without the second resonance region regardless of the shape of the current injection region.

Ninth Embodiment

The present embodiment discloses a surface emitting laser device which has a structure basically the same as that in any one of the first through seventh embodiments. In addition, in the surface emitting laser device of the present embodiment, a semiconductor layer capable of absorbing laser oscillation light may be provided at a position corresponding to an anti-node of an electric field standing wave in the second resonance region.

As described previously, due to the resonance action of the laser oscillation light in the second resonance region, the electric field strength increases in and in the area surrounding the second resonance region. Especially, because the electric field strength is a maximum at an anti-node of an electric field standing wave in the second resonance region, it is possible to absorb a large quantity of light. In other words, with a thin semiconductor layer capable of absorbing laser oscillation light being provided at a position corresponding to an anti-node of an electric field standing wave in the second resonance region, it is possible to obtain a strong light absorption effect. For example, the semiconductor layer capable of absorbing laser oscillation light may have a semiconductor multiple quantum well structure.

According to the present embodiment, it is possible to further suppress the high order transverse mode oscillation.

10th Embodiment

The present embodiment discloses a surface emitting laser device which has a structure basically the same as that in the ninth embodiment. In addition, in the surface emitting laser device of the present embodiment, the light-absorbing semiconductor layer may include a material having lattice strain.

For example, when it is difficult to use a light-absorbing semiconductor layer with a lattice, matching a substrate, for example, in a specified wavelength band, the light-absorbing semiconductor layer having lattice strain can be used instead.

In a surface emitting laser device having an oscillation wavelength in the long wavelength region, for example, it is difficult to ensure the lattice of a light-absorbing semiconductor layer matches a substrate formed from GaAs.

According to the present embodiment, for example, a GaInNAs semiconductor layer thinner than a critical film and having a lattice constant different from the substrate may be used as a light-absorbing layer, and usage of such a semiconductor layer does not cause reduction of crystal quality (that is, it still preserves a good reflection surface). In addition, a strong absorption effect can be obtained. As a result, it is possible to more efficiently suppress the high order transverse mode oscillation.

According to the present embodiment, it is possible to easily provide a light-absorbing semiconductor layer in a wide wavelength band, and this enables further efficient suppression of the high order transverse mode oscillation.

11th Embodiment

The present embodiment discloses a surface emitting laser device which has a structure basically the same as that in the eighth through 10th embodiments. In addition, in the surface emitting laser device of the present embodiment, the region without the second resonance region has a shape different from a shape of the current injection region, which is defined by the current confinement structure, and the shape of the region without the second resonance region is isotropic. Due to such a configuration, even when a light emission pattern in the active region has an anisotropic shape, it is possible to obtain an outgoing laser beam having an isotropic shape.

As described above, since the second resonance region includes light-absorbing layers, due to the resonance action, a strong absorption effect can be obtained, and the outgoing laser beam can be shaped to have any desired shape in accordance with the shape of the second resonance region. Therefore, even when a light emission pattern in the active region has an anisotropic shape, it is possible to obtain an outgoing laser beam having an isotropic shape.

In the surface emitting laser device of the related art, the shape of the emitted laser beam is determined by the shape of the current injection region. However, in an oxidation surface emitting laser device, because controllability and reproducibility of the oxidation rate is low in the selective oxidation process, it is difficult to obtain a current injection region having an isotropic shape with good reproducibility. In addition, because the oxidation rate changes due to the plane direction of a mesa, even though the mesa is processed to be an isotropic shape, such as a circle or a square, sometimes, the shape of the current injection region may be anisotropic. Further, when a surface emitting laser device is provided on an inclined substrate, it is possible to control the polarization direction; however, since a different plane direction appears on the mesa on the inclined substrate, the oxidation confinement does not proceed isotropically.

Because of the problem existing in the selective oxidation process, it is difficult to precisely control the shape and size of the current injection region.

In contrast, in the surface emitting laser device of the present embodiment, when the second resonance region includes light-absorbing layers, and when the region without the second resonance region is processed to be an isotropic shape, such as a circle or a square, the outgoing laser beam can be shaped to have an isotropic shape. In this case, the precision of the shape of the second resonance region is determined by the precision of a photolithography process and an etching process, and the controllability and reproducibility of these processes are better than the selective oxidation process. Therefore, it is possible to control the shape of the outgoing laser beam with good controllability and reproducibility, between lots or inside a wafer, and it is possible to greatly improve yields of the surface emitting laser device.

According to the surface emitting laser device of the present embodiment, it is possible to provide a surface emitting laser device capable of operation at high output in a single fundamental transverse mode, and able to emit an outgoing laser beam having uniform size and shape. That is, it is possible to provide a surface emitting laser device able to operate at high output in a single fundamental transverse mode, and to emit an outgoing laser beam having a uniform beam spot of an isotropic shape.

12th Embodiment

The present embodiment discloses a surface emitting laser device which has a structure basically the same as that in the first through 11th embodiments. In addition, the surface emitting laser device of the present embodiment is configured to emit a laser beam from a light-emitting side opposite to a substrate. An electrode is provided on a surface of one of the distributed Bragg reflectors on the light-emitting side, and the electrode has an opening within a boundary of the region occupied by the second resonance region, that is, on the center side relative to the boundary of the region occupied by the second resonance region.

Due to such a configuration, influence of the electrode on the fundamental transverse mode (that is, increase of loss) is suppressed to be small, and it is possible to provide a surface emitting laser device capable of operation at high output in a single fundamental transverse mode.

In the above-mentioned reference 2 and reference 3, the high order transverse modes are controlled by utilizing reduction of the reflectivity caused by an upper electrode. However, because the loss (reflectivity reduction) to be added to the high order transverse modes is small, a relatively small electrode opening is required.

In contrast, in the present embodiment, due to the second resonance region, the loss to be added to the high order transverse modes is large compared to those in reference 2 and reference 3, and the area of the region without the second resonance region can be made larger than the area of the electrode opening in the related art. Therefore, if an electrode is provided, which has an opening within the boundary of the region occupied by the second resonance region, to be spatially in agreement with the second resonance region, the influence of the electrode on the fundamental transverse mode (that is, increase of loss) can be suppressed to be small.

As described above, the area of the region without the second resonance region can be relatively large, and the size of the electrode opening can be rather small compared to the area of the region without the second resonance region to the extent of not significantly increasing the loss of the fundamental transverse modes. In this case, because the size of the electrode can be made large, the contact resistance can be reduced, and this prevents an increase of the resistance of the laser device.

Thus, according to the surface emitting laser device of the present invention, it is possible to provide a surface emitting laser device capable of operation at high output in a single fundamental transverse mode.

13th Embodiment

The present embodiment discloses a surface emitting laser device which has a structure basically the same as that in the first through 11th embodiments. In addition, the surface emitting laser device of the present embodiment is configured to emit a laser beam from a light-emitting side opposite to a substrate thereof, and an electrode is provided on a surface of one of the distributed Bragg reflectors on the light-emitting side, while the electrode has an opening in a portion of the second resonance region on a side of a center of the surface emitting laser device.

Due to such a configuration, it is possible to prevent reduction of the reflectivity caused by the electrode, to obtain high reflectivity, and to obtain a strong resonance action in the second resonance region.

As described below, when the second resonance region is provided near the surface of the distributed Bragg reflector, it is possible to fabricate the laser device by only one crystal growing step, making the fabrication step very simple. In this case, it is desirable that the number of layers be small in the distributed Bragg reflector provided between the second resonance region and the light emitting side, and the reflectivity of the distributed Bragg reflector becomes small. On the other hand, in order to obtain a strong resonance action in the second resonance region, a strong resonance is required in the second resonance region, and it is desirable that the reflectivity of the distributed Bragg reflector, which is provided between the second resonance region and the light emitting side, be sufficiently large. Therefore, an electrode is provided, which has an opening in a portion of the second resonance region on a side of a center of the surface emitting laser device, so as not to spatially overlap the region primarily corresponding to the high order transverse modes. Therefore, it is possible to prevent reduction of the reflectivity caused by the electrode, obtain high reflectivity, and obtain a strong resonance action in the second resonance region.

Thus, according to the surface emitting laser device of the present invention, it is possible to provide a surface emitting laser device capable of operation at high output in a single fundamental transverse mode.

14th Embodiment

The present embodiment discloses a surface emitting laser device which has a structure basically the same as that in the first through 13th embodiments. In addition, in the surface emitting laser device of the present embodiment, the position of the second resonance region is in a range from a position corresponding to about half of the number of pairs in one of the distributed Bragg reflectors including the second resonance region to a position on a side opposite to the active layer.

Due to such a configuration, as described previously, it is possible to obtain high resonance effect and efficiently suppress the high order transverse mode oscillation. Especially, when the second resonance region is provided at a position corresponding to about half of the pair number of the distributed Bragg reflector, strong resonance effect can be obtained, and the high order transverse mode oscillation can be suppressed efficiently.

15th Embodiment

The present embodiment discloses a surface emitting laser device which has a structure basically the same as that in the first through 14th embodiments. In addition, in the surface emitting laser device of the present embodiment, more than one second resonance regions are provided.

With such a configuration, it is possible to efficiently suppress the high order transverse mode oscillation.

16th Embodiment

The present embodiment discloses a surface emitting laser device which has a structure basically the same as that in the first through 15th embodiments. In addition, in the surface emitting laser device of the present embodiment, the active layer is formed from a III-V semiconductor material and has an oscillation wavelength longer than 1.1 μm, wherein the III element includes at least one of Ga and In, and the V element includes at least one of As, P, N, and Sb.

With a surface emitting laser device having an active layer formed from GaInAs(Sb) or others, oscillation at bands of 1.3 µm and 1.55 µm can be obtained, which are important bands in communications with optical fibers. In addition, because a high characteristic temperature can be obtained, this kind of surface emitting laser device is also important as a subscriber light source. Moreover, because high-speed communication can be performed with silica single mode fibers at the band of 1.3 µm, the single fundamental transverse mode oscillation is strongly desired.

Because the single fundamental transverse mode oscillation at high output is obtainable with the surface emitting laser module of the present embodiment, and because of a low resistance, high-speed operations can be realized with a change of the fiber coupling caused by variation of the driving condition.

Further, with a surface emitting laser device having an oscillation wavelength longer than 1.1 µm, the following effects are obtainable. Specifically, light in the wavelength band longer than 1.1 µm is characterized by a large intervalence band absorption in a p-type semiconductor material. In the present embodiment, if the second resonance region is provided in a distributed Bragg reflector formed from a p-type semiconductor material, the electric field strength becomes strong globally in the distributed Bragg reflector compared to the situation without providing the second resonance region, and it is possible to obtain a strong light absorption effect due to the material constituting the p-type distributed Bragg reflector. Therefore, it is possible to add a large absorption loss in addition to the mirror loss at the long wavelength band, and to efficiently suppress the high order transverse mode light oscillation. The effect of the present embodiment is particularly strong at the long wavelength band.

According to the present embodiment, it is possible to provide a surface emitting laser device capable of oscillation at high output in the single fundamental transverse mode in the wavelength band longer than 1.1 µm.

17th Embodiment

The present embodiment discloses a surface emitting laser device which has a structure basically the same as that in the first through 15th embodiments. In addition, in the surface emitting laser device of the present embodiment, the active layer is formed from a III-V semiconductor material and has an oscillation wavelength shorter than 1.1 µm, wherein the III element includes at least one of Al, Ga, and In, and the V element includes at least one of As and P.

For a selective oxidation surface emitting laser device operating at bands shorter than 1.1 µm, such as a band at 0.78 µm of AlGaAs-based materials, and a band at 0.65 µm of AlGaInP-based materials, because of the short oscillation wavelength, it is necessary to set a very small size of oxidation confinement in order to obtain the single fundamental transverse mode oscillation, but this causes increased operation voltages and reduced output due to heat generation in the laser device.

In contrast, in the present embodiment, because of the second resonance region provided at the middle of the distributed Bragg reflector, it is not necessary to set a small oxidation confinement as in the related art, and the operating voltages and heat generation can be maintained to be small.

Because the resistance is low at the short wavelength band, it is possible to provide a surface emitting laser device capable of oscillation at high output in the single fundamental transverse mode.

According to the present embodiment, it is possible to provide a surface emitting laser device capable of oscillation at high output in the single fundamental transverse mode at the wavelength band shorter than 1.1 µm, and can be used in an electrophotographic system or an optical disk system.

18th Embodiment

The present embodiment discloses a surface emitting laser device which has a structure basically the same as that in the first embodiment. In addition, in the surface emitting laser device of the present embodiment, the region where the second resonance region is not provided is within a distance from the center of the current injection region with the distance being in a range from 0.5 µm to 2 µm.

With such a configuration, it is possible to provide a surface emitting laser device capable of oscillation at high output in the single fundamental transverse mode, and especially a short wavelength surface emitting laser device suitable for a write light source in a high resolution electrophotographic system.

When applying a surface emitting laser device to the high resolution electrophotographic system, it is desired that the beam spot be sufficiently small in the single fundamental transverse mode, for example, 4 µm or less. From the view of wavelength sensitivity of a photoconductor, a laser device is desirable that oscillates at a short wavelength, for example, shorter than 850 nm, and a laser device having an oscillation wavelength at 780 nm is preferable.

However, in a selective oxidation surface emitting laser device operating in the above wavelength band, in order to set the size of the beam spot to be about 4 µm, it is necessary to set the diameter of the current injection region to be of roughly the same value, and this makes it difficult to attain the single fundamental transverse mode oscillation. In addition, in order to obtain a small beam spot, it is necessary to reduce the size of the current injection region accordingly, thereby, the resistance of the laser device increases greatly.

In contrast, in the present embodiment, due to the second resonance region, the single fundamental transverse mode oscillation is attainable. Further, a beam spot having any desired shape and size can be obtained in response to the shape of the region without the second resonance region regardless of the shape of the current injection region. Therefore, even when the current injection region is set to be large, because of the second resonance region, a beam spot can be obtained which is smaller than the current injection region.

According to the surface emitting laser device of the present embodiment, when the region without the second resonance region is set to be within a distance from the center of the current injection region with the distance being in a range from 0.5 µm to 2 µm, it is possible to solve the problems in the device resistance and oscillation mode, and it is possible to provide a surface emitting laser device with a size of the beam spot from about 1 µm to 4 µm, which is particularly suitable for a write light source in a high resolution electrophotographic system.

That is, the surface emitting laser device of the present embodiment is capable of oscillation at high output in the single fundamental transverse mode, and especially can be implemented to be a short wavelength surface emitting laser device suitable for a write light source in a high resolution electrophotographic system.

19th Embodiment

The present embodiment discloses a surface emitting laser array which is formed from the surface emitting laser device of any one of the first through 18th embodiments.

According to the present embodiment, it is possible to provide a surface emitting laser array which has small resistance, is capable of oscillation at high output in the single fundamental transverse mode, and is suitable for applications of a multi-beam write system in an electrophotographic system, or a light source in an optical communication system.

In addition, especially when the surface emitting laser device of any one of the eighth through 11th embodiments is used, it is possible to uniformly control the outgoing beams to have any desired shapes and sizes, thus being superior in beam uniformity inside the array.

20th Embodiment

The present embodiment discloses a method of producing a surface emitting laser device of the fourth or the fifth embodiment. According to the method, the second resonance region is formed by two crystal growing steps, specifically, a first crystal growing step of forming a semiconductor layer for use of the spacer layer having a thickness greater than a predetermined thickness by $\lambda/4n$ of the laser oscillation wavelength, and a second crystal growing step of, after etching and removing the semiconductor layer in the region without the second resonant region, forming another semiconductor layer having a thickness equaling $\lambda/4n$ of the laser oscillation wavelength.

With the method of the present embodiment, it is possible to easily form the second resonance region in a portion of the distributed Bragg reflector, with the phase conditions for multiple-reflection in the region without the second resonance region. That is to say, it is possible to easily fabricate a surface emitting laser device capable of operation at high output in a single fundamental transverse mode.

As described previously, the second resonance region has two types of structures. In the fourth embodiment, the second resonance region includes a spacer layer having a refractive index higher than the refractive index of the low refractive index layers in the distributed Bragg reflector, while in the fifth embodiment, the second resonance region includes a spacer layer having a refractive index lower than the refractive index of the high refractive index layers in the distributed Bragg reflector. In either of these two structures, the spacer layer in the second resonance region has a thickness equaling an integral multiple of $\lambda/2n$ (where $\lambda$ is the laser oscillation wavelength and n is the refractive index of the spacer layer in the second resonance region). As a result, the resonance phase condition is satisfied, and an electric field standing wave is generated.

In the fourth embodiment, the anti-node of the electric field standing wave is at the interface between the spacer layer constituting the second resonance region and the distributed Bragg reflector, while in the fifth embodiment, the node of the electric field standing wave is at the interface between the spacer layer constituting the second resonance region and the distributed Bragg reflector.

Below, it is assumed that the term "predetermined thickness" indicates a thickness equaling an integral multiple of $\lambda/2n$.

First, consider the case in which the second resonance region is formed from a high refractive index layer. After the low refractive index layer of the distributed Bragg reflector is formed by crystal growth, a thin semiconductor layer is formed by crystal growth having a thickness greater than a predetermined thickness (integral multiple of $\lambda/2n$) by $\lambda/4n$. This semiconductor layer is used as the spacer layer.

Then, the semiconductor layer in the region without the second resonance region is removed by etching, and next, another semiconductor layer is formed by crystal growth to a thickness equaling $\lambda/4n$. Hence, in the not-etched region, the spacer layer is formed to have a specified thickness. Meanwhile, in the etched region, a semiconductor layer having a thickness equaling $\lambda/4n$ (a high refractive index layer) is formed in the second crystal growth step on the low refractive index layer of the distributed Bragg reflector. Thus, if crystal growth of the distributed Bragg reflector is performed next from the low refractive index layer, a distributed Bragg reflector satisfying the phase conditions for multiple-reflection can be formed.

In this way, in both the etched region and the not-etched region, the second resonance region and the distributed Bragg reflector are fabricated at the same time while ensuring that the phase conditions for multiple-reflection are satisfied.

Next, consider the case in which the second resonance region is formed from a low refractive index layer. Similarly, after the high refractive index layer of the distributed Bragg reflector is formed by crystal growth, a thin semiconductor layer is formed by crystal growth to a thickness greater than a predetermined thickness (an integral multiple of $\lambda/2n$) by $\lambda/4n$. This semiconductor layer is used as the spacer layer.

Then, the semiconductor layer in the region without the second resonance region is removed by etching, and next, another semiconductor layer is formed by crystal growth to a thickness equaling $\lambda/4n$. Hence, in the not-etched region, the spacer layer is formed to have a specified thickness. Meanwhile, in the etched region, a semiconductor layer having a thickness equaling $\lambda/4n$ (a low refractive index layer) is formed in the second crystal growth step on the high refractive index layer of the distributed Bragg reflector. Thus, if crystal growth of the distributed Bragg reflector is performed next from the high refractive index layer, a distributed Bragg reflector satisfying the phase conditions for multiple-reflection can be formed.

In this way, in both the etched region and the not-etched region, the second resonance region and the distributed Bragg reflector are fabricated at the same time while ensuring that the phase conditions for multiple-reflection are satisfied.

According to the present embodiment, it is possible to easily form the second resonance region in a portion of the distributed Bragg reflector in the region where the second resonance region is not to be formed with the phase conditions for multiple-reflection being satisfied.

In addition, because it is easy to precisely control the thickness of the second resonance region and the phase conditions for multiple-reflection for the distributed Bragg reflector at the same time, it is possible to efficiently suppress the high order mode oscillation without decreasing the reflectivity relative to the fundamental transverse mode.

21st Embodiment

The present embodiment discloses a method of producing a surface emitting laser device of the fourth or the fifth embodiment. According to the method, the second resonance region is formed by a step of forming a semiconductor layer for use of the spacer layer to a predetermined thickness, a step of etching and removing the semiconductor layer in the predetermined region, in which the second resonance region is not to be provided, so that the semiconductor layer has a thickness satisfying optical multiple-reflection conditions in the distributed Bragg reflectors.

With the method of the present embodiment, the second resonance region can be formed easily when the second resonance region is to be provided near the surface of the distributed Bragg reflector.

Specifically, when the second resonance region is formed from a high refractive index layer, a semiconductor layer, which has a refractive index higher than the refractive index of the low refractive index layers in the distributed Bragg reflector, is provided between the low refractive index layers to a predetermined thickness (an integral multiple of $\lambda/2n$, (where $\lambda$ is the laser oscillation wavelength and n is the refractive index of the spacer layer in the second resonance region). Alternatively, when the second resonance region is formed from a low refractive index layer, a semiconductor layer, which has a refractive index lower than the refractive index of the high refractive index layers in the distributed Bragg reflector, is provided between the high refractive index layers to a predetermined thickness (an integral multiple of $\lambda/2n$). Then, after mesa formation, selective oxidation, burying mesa with resins, and electrode formation, a resist opening pattern is formed on the surface of the substrate to be aligned to the current injection region. Next, after removing a contact layer and the distributed Bragg reflector in the opening portion sequentially from the surface of the substrate by etching, etching and partially removing the spacer layer constituting the second resonance region are performed so that the remaining thickness of the spacer layer satisfies optical multiple-reflection conditions in the distributed Bragg reflectors. In this way, the second resonance region is formed in a region excluding the predetermined region within a distance from the center of the current injection region.

Here, a thickness satisfying the optical multiple-reflection conditions in the distributed Bragg reflectors is defined as below. When the second resonance region is formed from a high refractive index layer, it is preferable that the remaining thickness of the spacer layer be an odd integral multiple of $\lambda/2n$ because it is possible to maintain a high reflectivity of the distributed Bragg reflectors in the etched second resonance region. In addition, when the second resonance region is formed from a low refractive index layer, also from the point of view of the reflectivity, it is preferable that the spacer layer be totally removed so that the surface of the etched second resonance region is the high refractive index layer.

According to the present embodiment, it is possible to easily form the second resonance region with only an additional photolithography process and an etching process relative to the method of the related art for producing a surface emitting laser device, and it is possible to easily fabricate a surface emitting laser device capable of operation at high output in a single fundamental transverse mode.

22nd Embodiment

The present embodiment discloses a method of producing a surface emitting laser device based on the method as disclosed in the 20th embodiment and the 21st embodiment. In the method of the present embodiment, the step of etching and removing the semiconductor layer in the region without the second resonance region is performed by a combination of dry etching and wet etching.

With the method of the present embodiment, it is possible to fabricate the second resonance region with a uniform shape and good reproducibility.

As described previously, by means of etching, it is possible to easily form the second resonance region in a portion of the distributed Bragg reflector in the region where the second resonance region is not to be formed with the phase conditions for multiple-reflection being satisfied. During an etching process, the uniformity of the shape of the second resonance region is determined by controllability of a photolithography process and the etching process. The stability and reproducibility of these processes are better than the selective oxidation process, and other processes involved in fabrication of a surface emitting laser device, but it is necessary to improve the controllability of the etching process in order to precisely control the shape of the second resonance region.

For example, in a wet etching process, in the distributed Bragg reflector formed from AlGaAs-based materials, if an AlGaInP layer or the like is provided in the structure, the above-mentioned semiconductor layer serves as an etching stopping layer relative to a sulfuric acid-based etching solution, and enabling precise control of the etching depth. However, since the wet etching is basically an isotropic etching process, along with etching of the semiconductor layer in the depth direction, the semiconductor layer is also etched in the transverse direction. In addition, on the etching plane in the transverse direction, because of the different plane direction, the etched side surface may have a shape of a normal mesa or an inverted mesa, thereby, the problem in shape anisotropy occurs.

On the other hand, in a dry etching process, it is easy to reduce etching on the side surface, and obtain an etching profile superior in perpendicularity. However, because there is not an etching stopping layer of high selectivity, and even when a plasma light emitting monitor is used, it is difficult to control the etching depth with precision on the order of nanometers, that is, the controllability in the depth direction is low.

Upon this, in order to precisely control the shape of the second resonance region, in the method of the present embodiment, the step of etching and removing the semiconductor layer in the region without the second resonance region is performed by a combination of the dry etching process and the wet etching process.

Specifically, the dry etching is performed as the first etching process, and a plasma light emitting monitor or the like is used to monitor the etching process until an approximate etching depth is reached. Afterward, the wet etching is performed as the second etching process to a preset etching depth by using the etching stopping layer arranged in the structure in the crystal growth process. In this way, the side surface being etched can be made sharp, side-etching is suppressed to be small, and a high etching precision in the depth direction is obtained.

According to the present embodiment, it is possible to precisely and uniformly control the shape of the region without the second resonance region, and to greatly improve the uniformity of the beam spot shape and the yield of the laser device. In other words, according to the present embodiment, it is possible to easily fabricate a surface emitting laser device capable of operation at high output in the single fundamental transverse mode with a high yield.

23rd Embodiment

The present embodiment discloses a surface emitting laser module which is formed from the surface emitting laser device of any one of the first through 18th embodiments, or from the surface emitting laser array of the 19th embodiment.

The surface emitting laser device of any one of the first through 18th embodiments and the surface emitting laser array of the 19th embodiment are capable of stable oscillation at high output in the single fundamental transverse mode, and capable of high speed operation because of the low device resistance. Hence, a surface emitting laser module formed from the surface emitting laser device of any one of the first through 18th embodiments, or the surface emitting laser array of the 19th embodiment is also capable of high speed operation, and the coupling with an optical fiber is stable without any variation, thus being highly reliable.

According to the present embodiment, because the surface emitting laser module of the present embodiment is constructed by using the surface emitting laser device as described above or the above mentioned surface emitting laser array including plural of the surface emitting laser devices, it is possible to provide a surface emitting laser module capable of oscillation at high output in the fundamental transverse mode, capable of reliable coupling with an optical fiber, and able to suppress the high order mode oscillation. As a result, even when operating conditions (for example, output level) of the module change, the coupling condition and the optical input to the optical fiber barely change. In addition, because of a low resistance, high-speed operations can be realized. In the 23rd embodiment, according to the present invention, it is possible to provide a surface emitting laser module of high reliability and capable of high-speed operation at high output in the single fundamental transverse mode.

24th Embodiment

The present embodiment discloses an electrophotographic system in which a light source is formed from the surface emitting laser device of any one of the first through 18th embodiments, or from the surface emitting laser array of the 19th embodiment.

Because the surface emitting laser device of any one of the first through 18th embodiments and the surface emitting laser array of the 19th embodiment are capable of stable oscillation at high output in the single fundamental transverse mode, and because of the circular shape of the outgoing laser beam and high position precision between laser arrays, multiple laser beams can be easily condensed by the same lens with good reproducibility. Thus, it is possible to provide a high speed electrophotographic system having a simple optical system, low cost and a high resolution.

Further, because the surface emitting laser device as described above or the above mentioned surface emitting laser array in the electrophotographic system is capable of high output in the fundamental transverse mode, when an array is used, a very high write speed can be obtained, and it is possible to realize a high-speed electrophotographic system.

According to the present embodiment, because the electrophotographic system of the present embodiment is formed from the surface emitting laser device as described above, or the above mentioned surface emitting laser array including plural of the surface emitting laser devices, when the surface emitting laser device or the surface emitting laser array is used as a write light source in the electrophotographic system, because the outgoing laser beam is of a circular shape, it is easy to shape the laser beam. In addition, when the surface emitting laser array is used, because of the high position precision between the laser arrays, multiple laser beams can be easily condensed by the same lens with good reproducibility. Thus, it is possible to provide a high speed electrophotographic system having a simple optical system, low cost and a high resolution.

Further, because the surface emitting laser device as described above and the above mentioned surface emitting laser array in the electrophotographic system are capable of high output in the fundamental transverse mode, when an array is used, a very high write speed can be obtained, and it is possible to obtain a high-speed electrophotographic system having a high resolution.

25th Embodiment

The present embodiment discloses an optical communication system in which a light source is formed from the surface emitting laser device of any one of the first through 18th embodiments, or from the surface emitting laser array of the 19th embodiment.

The surface emitting laser device of any one of the first through 18th embodiments and the surface emitting laser array of the 19th embodiment are capable of stable oscillation at high output in the single fundamental transverse mode, and capable of reliable coupling with an optical fiber. In addition, because the high order mode oscillation is suppressed, the transverse mode is stable even when operating conditions of the laser device or the laser array change. In addition, because of a low resistance of the laser device, high-speed operations can be realized. Further, because high output is obtainable compared to the related art, it is possible to realize long distance communications. Therefore, by using there laser devices and laser arrays as light sources, it is possible to provide an optical communication system of high reliability and stable coupling with the optical fiber and capable of high speed and long distance communications.

According to the present embodiment, the optical communication system of the present invention includes the surface emitting laser device or the surface emitting laser array as described above. Because the surface emitting laser device and the surface emitting laser array are capable of oscillation at high output in the fundamental transverse mode, it is possible to obtain reliable coupling with an optical fiber. In addition, because the high order mode oscillation is suppressed, the coupling condition and the optical input to the optical fiber barely change even when operation conditions (for example, output level) of the laser device or laser array change. In addition, because of a low resistance, high-speed operations can be realized. Further, because high output is obtainable compared to the related art, it is possible to realize long distance communications. In other words, according to the present invention, it is possible to provide an optical communication system of high reliability, stable coupling with the optical fiber, and capable of high speed communications.

26th Embodiment

The present embodiment discloses an optical interconnection system in which a light source is formed from the surface emitting laser device of any one of the first through 18th embodiments, or from the surface emitting laser array of the 19th embodiment.

The surface emitting laser device of any one of the first through 18th embodiments and the surface emitting laser array of the 19th embodiment are capable of stable oscillation at high output in the single fundamental transverse mode, capable of reliable coupling with an optical fiber, and the transverse mode is stable even when operation conditions of the laser device or the laser array change. In addition, because of a low resistance of the laser device, high-speed operations can be realized. Therefore, by using these laser devices and laser arrays as light sources, it is possible to provide an optical interconnection system of high reliability.

According to the present embodiment, the optical interconnection system includes the surface emitting laser device or the surface emitting laser array as described above. Because the surface emitting laser device and the surface emitting laser array are capable of oscillation at high output in the fundamental transverse mode, it is possible to obtain reliable coupling with an optical fiber. In addition, because the high order mode oscillation is suppressed, the coupling condition and the optical input to the optical fiber barely change even when operating conditions (for example, output level) of the laser device or laser array change. In addition, because of a low resistance, high-speed operations can be realized. Therefore, it is possible to provide an optical interconnection system of high reliability and stable coupling with the optical fiber and capable of high speed transmission.

As described above, in order to solve the problems in the related art. Specifically, in order to selectively add a large loss to the high order transverse mode to realize oscillation at high output in the fundamental transverse mode, in the present invention, the second resonance region is provided in an area at the middle of the distributed Bragg reflector corresponding to the high order transverse modes, and due to the resonance action of the laser oscillation light in the second resonance region, it is possible to selectively add a large mirror loss for the high order transverse mode oscillation compared to the related art, as a result, it is possible to efficiently suppress the high order transverse mode oscillation.

In addition, because the second resonance region includes light-absorbing materials, and due to the resonance action of the laser oscillation light in the second resonance region, the electric field strength increases in the second resonance region, a large absorption loss is further added to the high order transverse mode, and this enables highly efficient suppression of the high order transverse mode oscillation.

In addition, in the selective oxidation surface emitting laser device, because the high order transverse mode oscillation can be strongly suppressed, it is possible to set a large current injection region compared to the related art, and it is possible to reduce the operating voltages and heat generation and obtain oscillation at high output in the single fundamental transverse mode.

In addition, in an ion implantation surface emitting laser device, similarly, because it is possible to highly efficiently suppress high order transverse mode oscillation, it is possible to obtain stable oscillation at high output in the single fundamental transverse mode.

EXAMPLE 1

Figure 7:
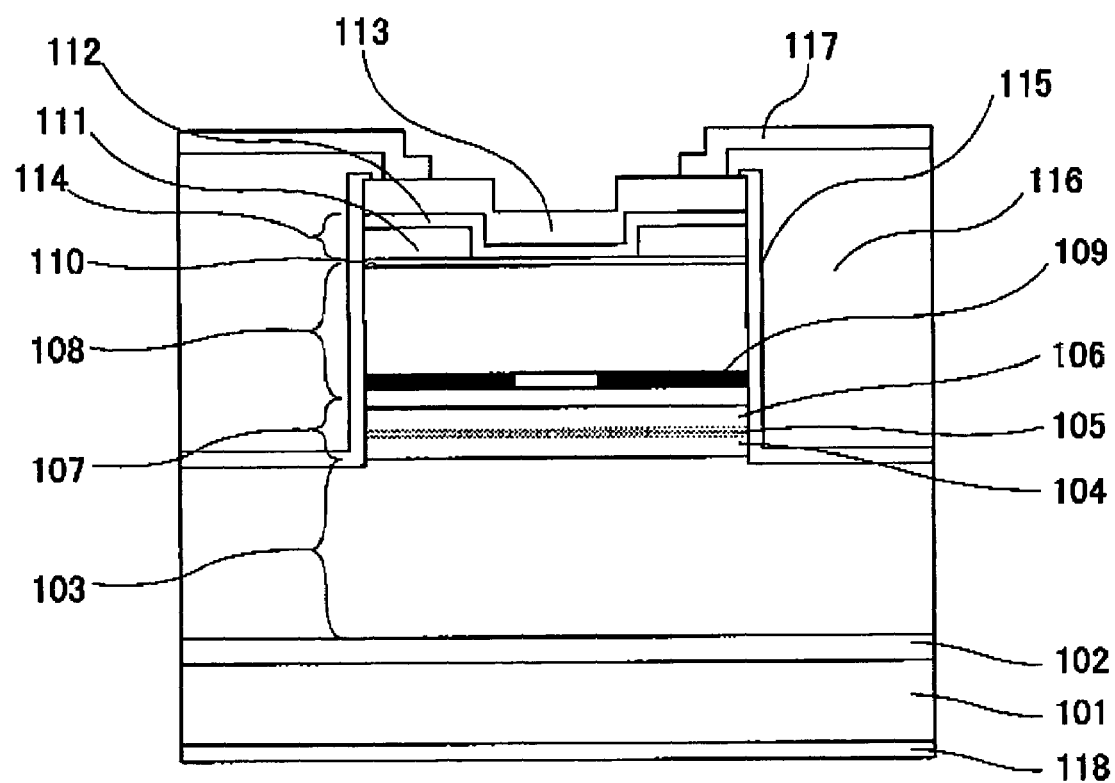
FIG. 7 is a cross-sectional view of a surface emitting laser device according to a first example of the present invention.

FIG. 7 is a cross-sectional view of a surface emitting laser device according to a first example of the present invention.

The surface emitting laser device shown in FIG. 7 has an active region formed from an InGaAs/GaAs multiple quantum well structure and operates at the band of 0.98 μm. Below, a fabrication process of the surface emitting laser device shown in FIG. 7 is explained.

When fabricating the surface emitting laser device shown in FIG. 7, crystal growth is performed by MOCVD (Metal-Organic CVD), trimethylaluminum (TMA), trimethylgalium (TMG) and trimethylindium (TMI) are used as the stock materials of the group-III elements, and an arsine ($AsH_3$) gas is used as the stock material of the group-V element. In addition, carbon bromide (CBr4) is used as the stock material of the p-type dopant, and hydrogen selenide (H2Se) is used as the stock material of the n-type dopant.

Specifically, the first crystal growth process for fabricating the surface emitting laser device shown in FIG. 7 is performed, in which an n-GaAs buffer layer 102, a 36-pair lower distributed Bragg reflector 103, a one-wavelength resonator 107 including a non-doped GaAs spacer layer 104, an active region 105, and a non-doped GaAs spacer layer 106, a 23.5-pair first upper distributed Bragg reflector 108, an etching stopping layer 110, and a GaAs layer 111 are formed on an n-GaAs substrate 101.

The lower distributed Bragg reflector 103 includes 36 pairs of n-$Al_{0.9}Ga_{0.1}As$/GaAs layers. The active region 105 is formed from an InGaAs/GaAs multiple quantum well structure. The first upper distributed Bragg reflector 108 is formed from 23.5 pairs of p-$Al_{0.9}Ga_{0.1}As$/GaAs layers. The etching stopping layer 110 is formed from p-$Ga_{0.5}In_{0.5}P$. The GaAs layer 111 has a thickness of $\lambda/4n$ (where $\lambda$ is the laser oscillation wavelength; here, it is 0.98 μm, and n represents the refractive index relative to the oscillation light.)

A p-AlAs selective oxidation layer 109 is provided at the middle of the first upper distributed Bragg reflector 108.

Thicknesses of the semiconductor layers constituting the distributed Bragg reflectors are $\lambda/4n$ so as to satisfy the phase conditions for multiple-reflection in the distributed Bragg reflectors. The same thicknesses are also used in the following examples. Here, for example, the p-$Ga_{0.5}In_{0.5}P$ etching stopping layer 110 is 20 nm in thickness, and serves as a portion of the low refractive index ($Al_{0.9}Ga_{0.1}As$) of the upper distributed Bragg reflector 108 so as not to disturb the Bragg reflection phase conditions.

The resonance region 107, which includes the non-doped GaAs spacer layer 104, the active region 105 formed from an InGaAs/GaAs multiple quantum well structure, and the non-doped GaAs spacer layer 106, has such a thickness that the phase change of the oscillation light in these regions is $2\pi$, thus forming a one-wavelength resonator structure.

The InGaAs/GaAs multiple quantum well active region 105 is arranged at the center of a resonance region corresponding to an anti-node of the electric field standing wave so as to obtain a high induced emission probability.

The same structure of the resonance region including the active region is also used in the following examples.

Next, with a well-known photolithography technique, a resist pattern having a square opening is formed at the center portion of the surface emitting laser device in FIG. 7, with each side of the square opening being 8 μm. Then, by utilizing the p-$Ga_{0.5}In_{0.5}P$ etching stopping layer 110, the GaAs layer 111 within the square opening of the resist is removed by a thickness equaling $\lambda/4n$ with sulfuric acid-based etchants.

Next, after removing the resist and cleaning the substrate surface, the second crystal growth process is performed, in which a p-GaAs layer 112 is grown to have a thickness of $\lambda/4n$, then, a second upper distributed Bragg reflector 113 is formed from two pairs of p-$Al_{0.9}Ga_{0.1}As$/GaAs layers starting from a p-$Al_{0.9}Ga_{0.1}As$ layer.

Here, on an outermost surface layer of the second upper distributed Bragg reflector 113, a not-illustrated p-GaAs contact layer is provided to increase the doping concentration near the outermost surface of the second upper distributed Bragg reflector 113.

Following the above procedure of crystal growth, it is possible to reduce the influence of surface oxidation in the second crystal growth process, and obtain a surface emitting laser device having a good crystalline property.

Figure 8:
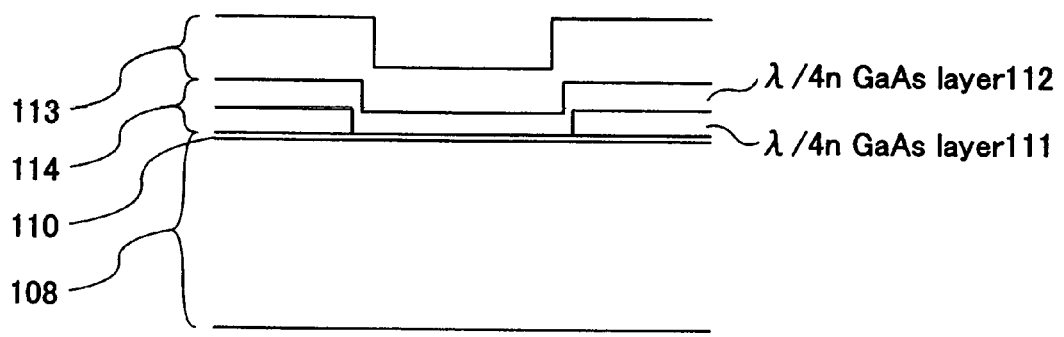
FIG. 8 is a cross-sectional view of the surface emitting laser-device in FIG. 7 for illustrating a structure between the first upper distributed Bragg reflector 108 and the second upper distributed Bragg reflector 113.

FIG. 8 is a cross-sectional view of the surface emitting laser device in FIG. 7, fabricated following the above procedure, for illustrating the structures between the first upper distributed Bragg reflector 108 and the second upper distributed Bragg reflector 113.

In the not-etched region of the GaAs layer 111, that is, the region of the GaAs layer 111 that is not etched and reduced by a thickness of $\lambda/4n$, which primarily corresponds to the high order transverse mode distribution, a second resonance region 114 formed from a GaAs resonance layer having a thickness of $\lambda/2n$ is provided between the first upper distributed Bragg reflector 108 and the second upper distributed Bragg reflector 113.

While, in the etched region of the GaAs layer 111, that is, the region of the GaAs layer 111 that is etched and reduced by a thickness of $\lambda/4n$, which primarily corresponds to the fundamental transverse mode distribution, the p-GaAs layer 112 having a thickness of $\lambda/4n$ is arranged so as to satisfy the phase conditions for multiple-reflection in the distributed Bragg reflector.

Next, with a well-known photolithography technique, a resist pattern having a square opening is formed with each side of the square opening being 30 μm.

Then, with a well-known dry etching technique, the layers on the n-$Al_{0.9}Ga_{0.1}As$/GaAs lower distributed Bragg reflector 103 are removed by etching, forming a square mesa. Next, in a heating atmosphere including water vapor, selective oxidation of the p-AlAs selective oxidation layer 109 is performed in a direction parallel to the substrate from an etching end surface to the center of the mesa, and thereby, a current confinement structure is formed. In FIG. 7, the indicated black regions are the selectively oxidized regions, and each side of the non-oxidized region (current injection region) is 6 μm long.

Next, by means of CVD (Chemical Vapor Deposition), a $SiO_2$ layer 115 is formed on the whole wafer. After that, an insulating resin 116 is formed while being aligned to the center of the mesa.

Next, $SiO_2$ layer 115 is removed while being aligned to an insulating resin removal part.

Next, a resist pattern having a square opening is formed in a region serving as a light emitting portion on the mesa, with each side of the square opening being 10 μm, and a material for a p-side electrode is evaporated.

Next, the material of the electrode at the light emitting portion is lift-flowed to form the p-side electrode 117.

Next, the back surface of the n-GaAs substrate 101 is polished, then an n-side electrode 118 is formed on the back surface of the n-GaAs substrate 101 by evaporation, and the p-side electrode 117 and the n-side electrode 118 are ohmic-connected by annealing.

In this example, because of the second crystal growth process, when a distributed Bragg reflector including a contact layer is provided at the position corresponding to the current injection region, uniform current injection can be performed by current spread in the contact layer, and thereby, the resistance can be reduced.

In the surface emitting laser device shown in this example, which has an oscillation wavelength of 0.98 μm, since the actual thickness of $\lambda/4n$ of the GaAs layer 111 removed by etching is only 69.5 nm, the unevenness of the surface of the laser device is very small, therefore, it is possible to fabricate the laser device by the same way as that in the related art.

This is also true for laser devices having other oscillation wavelengths. For example, in a surface emitting laser device which, similar to the present example, uses a GaAs layer as a high refractive index spacer layer and operates at an oscillation wavelength of 1.3 μm, the thickness being removed by etching is 95.2 nm. In addition, in a surface emitting laser device which uses a $Ga_{0.5}In_{0.5}P$ layer as the high refractive index spacer layer and operates at an oscillation wavelength of 0.78 μm, the thickness being removed by etching is 57.1 nm. In both cases, because the etching depth is very small, the unevenness of the surface of the laser device is also very small.

In the surface emitting laser device shown in this example, due to the resonance action in the second resonance region 114, a large mirror loss is selectively added to the high order transverse mode, and the high order transverse mode oscillation is efficiently suppressed.

In addition, because of the high order transverse mode oscillation is efficiently suppressed due to the second resonance region 114, it is not necessary to set the non-oxidized region (current injection region) to be very small, as in the related art. Thus, the device resistance (in turn, operation voltage) is low, and the saturation level associated with heat generation is increased. As a result, it is possible to realize oscillation at high output in the single fundamental transverse mode.

As for the structure of the surface emitting laser device, in addition to the above-mentioned structures, it is possible to use a low refractive index layer as the spacer layer.

Figure 9:
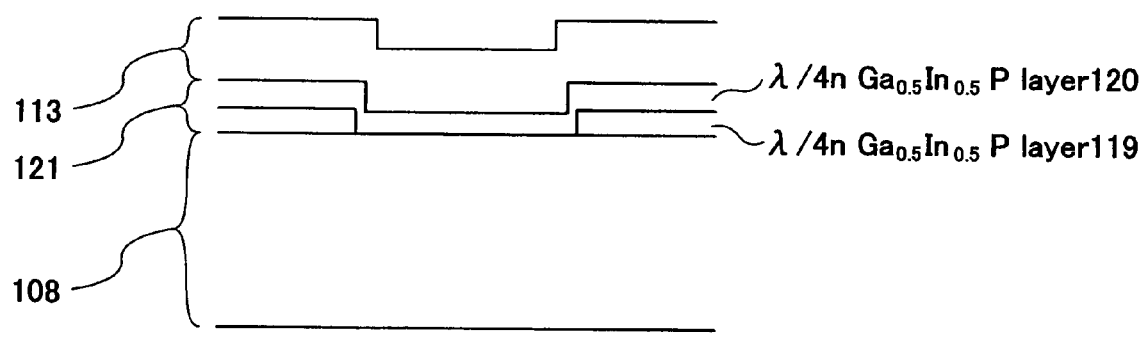
FIG. 9 is a cross-sectional view of the surface emitting laser device of the first example in which the second resonance region has a half-wavelength resonator structure.

FIG. 9 is a cross-sectional view of the surface emitting laser device of the present example in which the second resonance region has a half-wavelength resonator structure.

In FIG. 9, similar to FIG. 7 and FIG. 8, after a 23-pair first upper distributed Bragg reflector 108 is formed by crystal growth, specifically, after the first upper distributed Bragg reflector 108, specifically, until the GaAs layer of the first upper distributed Bragg reflector 108, is grown, a portion of a low refractive index spacer layer, specifically, until a p-$Ga_{0.5}In_{0.5}P$ layer 119 having a thickness of $\lambda/4n$, is grown in the first crystal growth process. Next, with the outermost GaAs layer of the first upper distributed Bragg reflector 108 as an etching stopping layer, the p-$Ga_{0.5}In_{0.5}P$ layer is removed by etching using hydrochloric acid-based etchants. After that, the second crystal growth process is performed, in which, again, a p-$Al_{0.9}Ga_{0.1}As$ layer 120 is grown to have a thickness of $\lambda/4n$, then, a 2.5-pair second upper distributed Bragg reflector 113 is formed by crystal growth starting from a p-GaAs layer.

With this method, in the region outside the current injection region, which primarily corresponds to the high order transverse mode distribution, a half-wavelength resonator structure 121 is formed, and the same resonance effect as those of the second resonance region 114 in FIG. 7 and FIG. 8 can be obtained.

In addition, when a GaInP material is used for the low refractive index spacer layer, as in the example shown in FIG. 9, because influence of oxidation is low, similar to a material including aluminum, it is easy to perform the second crystal growth process.

In the example shown in FIG. 9, in a surface emitting laser device having an oscillation wavelength of 0.98 μm, the thickness being removed by etching is 74.8 nm, and in a surface emitting laser device having an oscillation wavelength of 1.3 μm, the thickness being removed by etching is 101.8 nm.

In above examples, the second resonance region 114 is arranged at a position corresponding to the third pair of the upper distributed Bragg reflector from the surface of the upper distributed Bragg reflector, but the second resonance region 114 may be arranged at other positions. For example, when the second resonance region 114 is arranged near the center portion of the distributed Bragg reflector, much strong resonance effect can be obtained, and it is possible to further increase the mirror loss at the position of the second resonance region 114.

Figure 10:
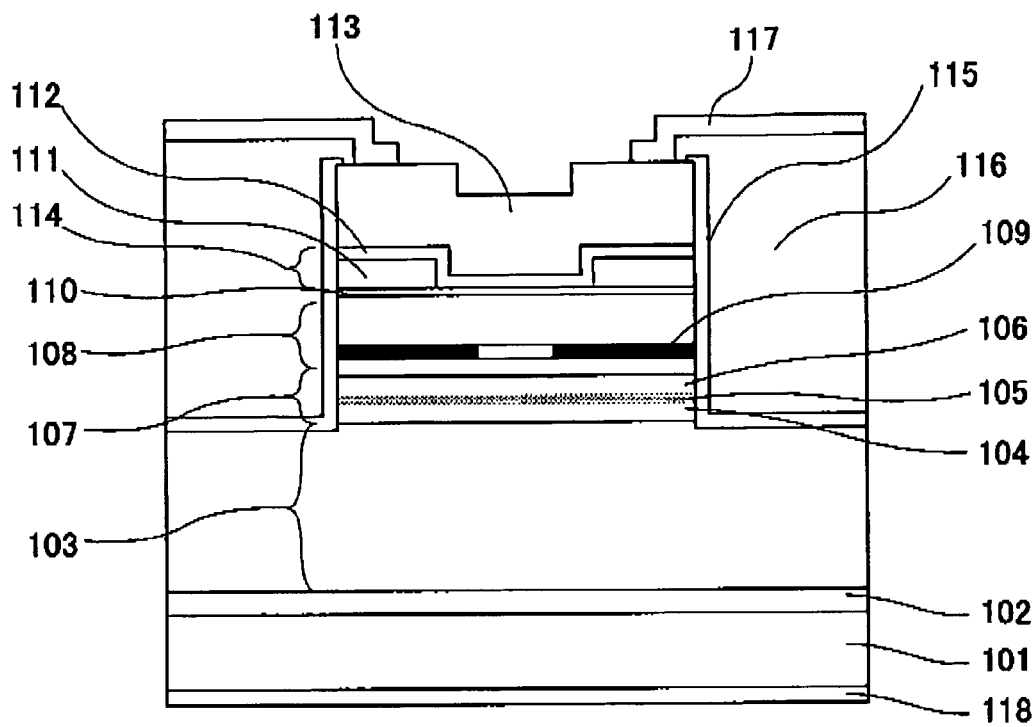
FIG. 10 is a cross-sectional view of the surface emitting laser device of the first example in which the second resonance region is arranged near the center portion of the distributed Bragg reflector.

FIG. 10 is a cross-sectional view of the surface emitting laser device of the present example in which the second resonance region is arranged near the center portion of the distributed Bragg reflector.

The surface emitting laser device shown in FIG. 10 is basically the same as that in FIG. 7, except that the position of the second resonance region is different, particularly, it operates at the band of 0.98 μm.

In FIG. 10, similar to FIG. 7, after a crystal growth process is performed until a non-doped GaAs spacer layer 106 is formed, a 13.5-pair first upper distributed Bragg reflector 108 formed from p-$Al_{0.9}Ga_{0.1}$As/GaAs layers, a p-$Ga_{0.5}In_{0.5}$P etching stopping layer 110, and a GaAs layer 111 having a thickness of λ/4n (where λ is the laser oscillation wavelength, here, it is 0.98 μm, and n represents the refractive index relative to the oscillation light) are formed in the first crystal growth process.

Next, the same as in the surface emitting laser device shown in FIG. 7, a resist pattern having a square opening is formed at the center portion of the laser device with each side of the square opening being 8 μm. Then, the p-GaAs layer 111 within the square opening of the resist is reduced by a thickness of λ/4n with sulfuric acid-based etchants.

Next, after removing the resist and cleaning the substrate surface, the second crystal growth process is performed, in which the p-GaAs layer 112 is grown to a thickness of λ/4n. Then, a 12-pair second upper distributed Bragg reflector 113 is formed from p-$Al_{0.9}Ga_{0.1}$As/GaAs layers starting from a p-$Al_{0.9}Ga_{0.1}$As layer. After that, the same procedure as that described with reference to FIG. 7 is followed to fabricate the surface emitting laser device shown in FIG. 10.

In the surface emitting laser device shown in FIG. 10, in the region near the center portion of the laser device, which corresponds to the fundamental transverse mode distribution, the upper distributed Bragg reflector is formed, which includes totally 26 pairs; while in the peripheral region, which corresponds to the high order transverse mode distribution, the second resonance region 114, which includes a high refractive index layer having a thickness of λ/2n, is arranged at a position corresponding to the 14th pair of the upper distributed Bragg reflector (about half of the total pair number) from the active layer side. With the method shown with reference to FIG. 10 involving a re-growth process, it is easy to form the second resonance region neat the center portion of the distributed Bragg reflector. Therefore, with the surface emitting laser device shown in FIG. 10, it is possible to obtain oscillation at high output in the single fundamental transverse mode.

EXAMPLE 2

Figure 11:
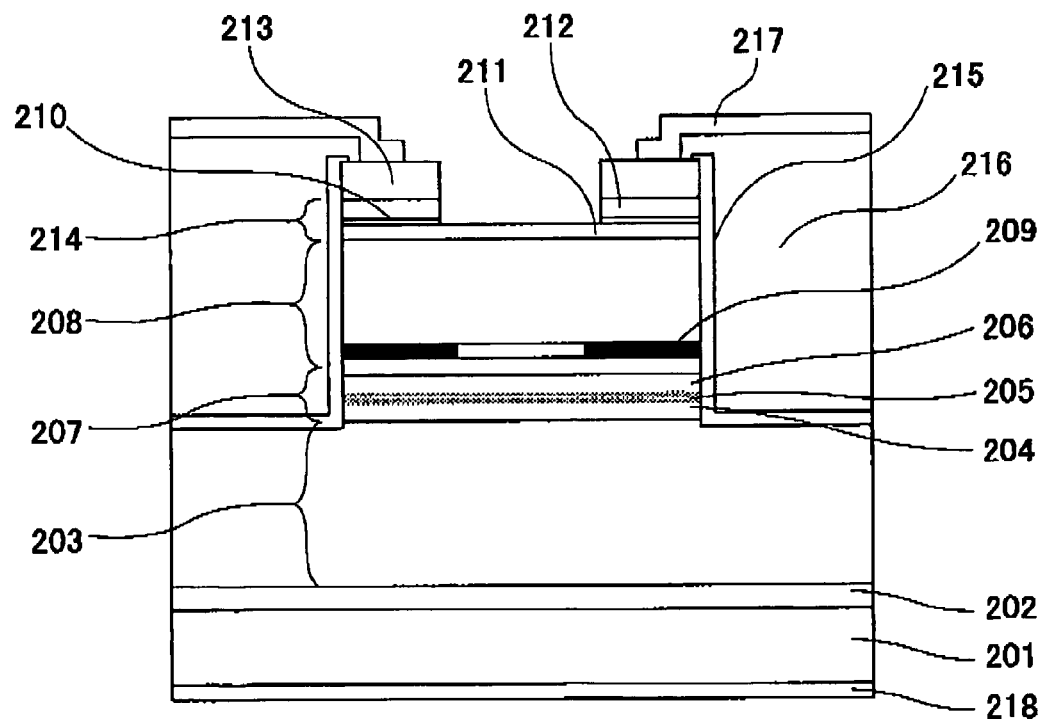
FIG. 11 is a cross-sectional view of a surface emitting laser device according to a second example of the present invention.

FIG. 11 is a cross-sectional view of a surface emitting laser device according to a second example of the present invention.

The surface emitting laser device shown in FIG. 11 has an active region formed from a GaInNAs/GaAs multiple quantum well structure and operates at the band of 1.3 μm, and can be fabricated in a way similar to that described above. For example, dimethyl hydrazine (DMHy) is used as the stock material of nitrogen for the GaInNAs/GaAs active region. In the present example, part of the structure of the p-type surface emitting laser device is different from that in FIG. 7. Below, a fabrication process of the surface emitting laser device shown in FIG. 11 is explained.

When fabricating the surface emitting laser device shown in FIG. 11, an n-GaAs buffer layer 202, a 36-pair lower semiconductor distributed Bragg reflector 203, a one-wavelength resonator 207 including a non-doped GaAs spacer layer 204, an active region 205, and a non-doped GaAs spacer layer 206, a 24.5-pair first upper distributed Bragg reflector 208, a GaAs layer 211, an etching stopping layer 210, a GaAs layer 212, and a second upper distributed Bragg reflector 213 are sequentially formed on an n-GaAs substrate 201.

The lower distributed Bragg reflector 203 includes 36 pairs of n-$Al_{0.9}Ga_{0.1}$As/GaAs layers. The active region 205 is formed from a GaInNAs/GaAs multiple quantum well structure. The first upper distributed Bragg reflector 208 is formed from 24.5 pairs of p-$Al_{0.9}Ga_{0.1}$As/GaAs layers. Each of the GaAs layer 211 and the GaAs layer 212 has a thickness of λ/4n (where λ is the laser oscillation wavelength, here, it is 1.3 μm, and n represents the refractive index relative to the oscillation light). The etching stopping layer 210 is formed from p-$Ga_{0.5}In_{0.5}$P and has a thickness of 10 nm. The second upper distributed Bragg reflector 213 is formed from two pairs of p-$Al_{0.9}Ga_{0.1}$As/GaAs layers starting from a p-$Al_{0.9}Ga_{0.1}$As layer.

Here, when the etching stopping layer 210 is provided as in the present example, in order to satisfy the resonance conditions, it is desirable that the thickness of the GaAs layer 211 be adjusted so that the total phase change of the oscillation light in the p-$Ga_{0.5}In_{0.5}$P etching stopping layer 210 and in the GaAs layer 211 becomes π/2.

Here, a p-AlAs selective oxidation layer 109 is provided at the middle of the first upper distributed Bragg reflector 208. The GaAs layer 211 having a thickness of λ/4n, the GaAs layer 212 having a thickness of λ/4n, and the p-$Ga_{0.5}In_{0.5}$P etching stopping layer 210 are forms a spacer layer of a second resonance region 214. Although not illustrated, a contact layer is provided on the surface of the upper distributed Bragg reflector 213.

Next, with the well-known photolithography technique, a resist pattern having a square opening is formed with each side of the square opening being 30 μm. Then, with the well-known dry etching technique, the layers on the n-$Al_{0.9}Ga_{0.1}$As/GaAs lower distributed Bragg reflector 203 are removed by etching, forming a square mesa.

Next, selective oxidation of the p-AlAs selective oxidation layer 109 is performed in the same way as in the example 1, forming a $SiO_2$ layer 215 and an insulating resin 216. Here, it is assumed that the width of the current injection region is 12 μm.

Next, with the well-known photolithography technique, a resist pattern having a square opening is formed at the center of the mesa with each side of the square opening being 12 μm. Then, with the well-known dry etching technique, the layers from the GaAS contact layer on the surface to the middle of the GaAs layer 212 having a thickness of λ/4n are removed by etching. For example, a plasma light emitting monitor is used to confirm etching conditions of the layers.

Then, by wet etching using sulfuric acid-based etchants, the remaining portion of the GaAs layer 212 on the p-$Ga_{0.5}In_{0.5}$P etching stopping layer 210 is removed by etching. Then, the p-$Ga_{0.5}In_{0.5}$P etching stopping layer 210 is removed by etching using hydrochloric acid-based etchants.

Figure 12:
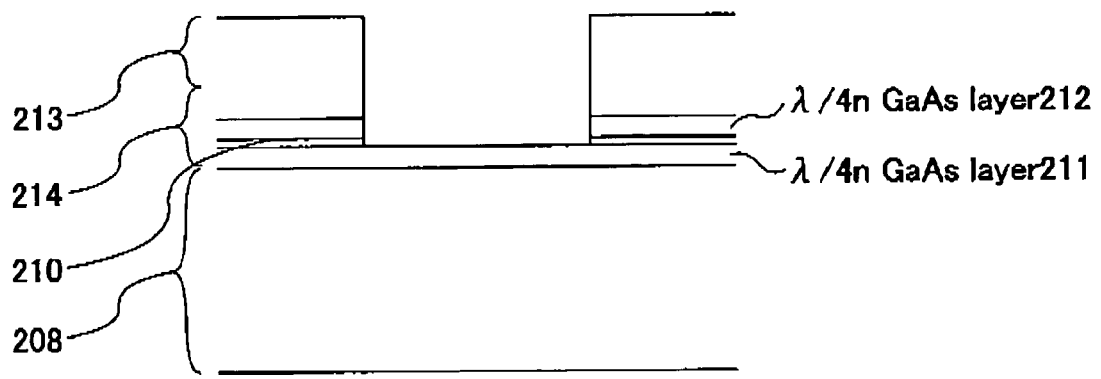
FIG. 12 is a cross-sectional view of the surface emitting laser device in FIG. 11 for illustrating the structure between the first upper distributed Bragg reflector 208 and the second upper distributed Bragg reflector 213.

FIG. 12 is a cross-sectional view of the surface emitting laser device in FIG. 11, fabricated following the above procedure, for illustrating the structures between the first upper distributed Bragg reflector 208 and the second upper distributed Bragg reflector 213.

Because the first etching process, in which the thickness of the layers to be removed by etching is large, is performed by the dry etching, the side surface being etched can be made sharp. Further, because the wet etching is performed to remove the residual films, a high etching precision in the depth direction is obtainable.

It should be noted that other etching techniques could be used in addition to the above methods. For example, layers on the p-$Ga_{0.5}In_{0.5}P$ etching stopping layer 210 can be removed at one time by performing the wet etching only once using sulfuric acid-based etchants.

Next, a p-side electrode 217 and a n-side electrode 218 are formed by evaporation, and are then ohmic-connected, forming the surface emitting laser device shown in FIG. 11.

As shown above, in the present example, the surface emitting laser device is formed by performing crystal growth only once, hence, the fabrication process is simple.

In the surface emitting laser device shown in the present example, the same as the example 1, due to the resonance action in the second resonance region 214, a large mirror loss is selectively added to the high order transverse mode, thus the high order transverse mode oscillation is efficiently suppressed. In addition, because of the high order transverse mode oscillation is efficiently suppressed due to the second resonance region 114, it is not necessary to set the non-oxidized region (current injection region) to be very small, as in the related art. Thus, the device resistance (in turn, operation voltage) is low, and the saturation level associated with heat generation is increased. As a result, it is possible to realize oscillation at high output in the single fundamental transverse mode.

Example 3

Figure 13:
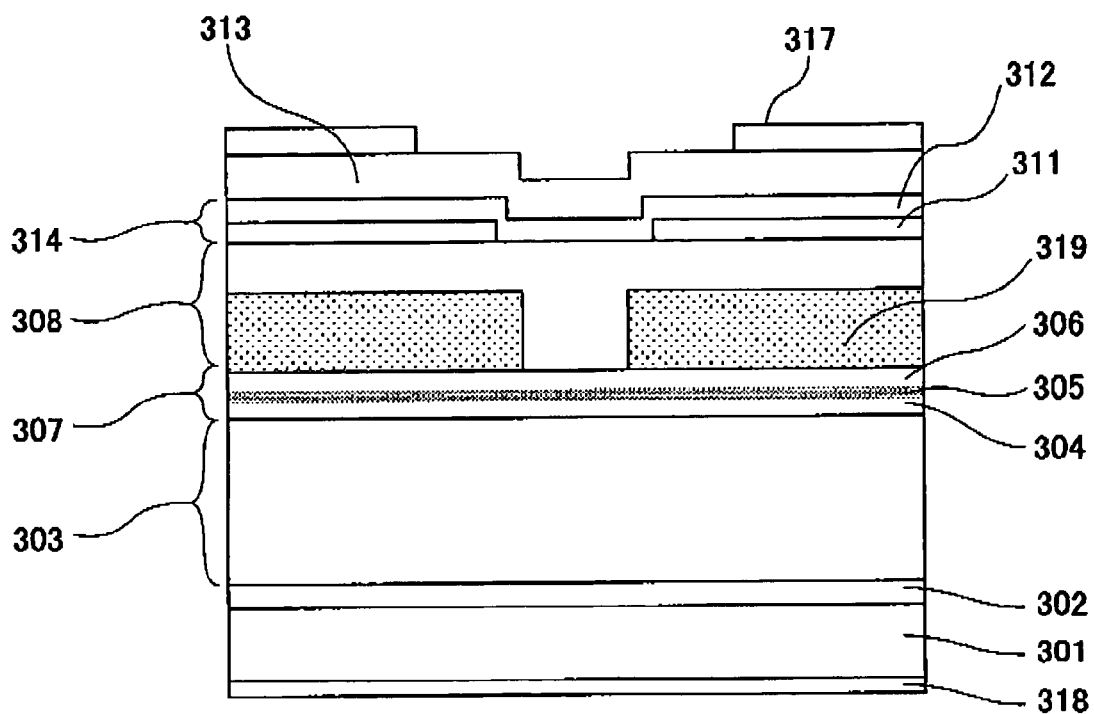
FIG. 13 is a cross-sectional view of a surface emitting laser device according to a third example of the present invention.

FIG. 13 is a cross-sectional view of a surface emitting laser device according to a third example of the present invention.

The surface emitting laser device shown in FIG. 13 has an active region formed from a GaAs/$Al_{0.15}Ga_{0.85}As$ multiple quantum well structure and operates at the band of 0.85 μm, and can be fabricated in a way similar to the example 1. Specifically, the surface emitting laser device shown in FIG. 13 differs from that of the example 1 in that the current confinement structure is a high resistance region formed by hydrogen ion implantation. Below, a fabrication process of the surface emitting laser device shown in FIG. 13 is explained.

As described below, in the surface emitting laser device shown in FIG. 13, a second resonance region 314 is provided to have a half-wavelength resonator structure with a $Ga_{0.5}In_{0.5}P$ layer as a low refractive index layer.

When fabricating the surface emitting laser device shown in FIG. 13, a first crystal growth process is performed, in which an n-GaAs buffer layer 302, a 36-pair lower distributed Bragg reflector 303, a one-wavelength resonator 307 including a non-doped $Al_{0.15}Ga_{0.85}As$ spacer layer 304, an active region 305, and a non-doped $Al_{0.15}Ga_{0.85}As$ spacer layer 306, a 23-pair first upper distributed Bragg reflector 308, and a $Ga_{0.5}In_{0.5}P$ layer 311 are formed sequentially on an n-GaAs substrate 301.

The lower distributed Bragg reflector 303 includes 36 pairs of n-$Al_{0.9}Ga_{0.1}As$/$Al_{0.15}Ga_{0.85}As$ layers The active region 305 is formed from a GaAs/$Al_{0.15}Ga_{0.85}As$ multiple quantum well structure. The first upper distributed Bragg reflector 308 is formed from 23 pairs of p-$Al_{0.9}Ga_{0.1}As$/$Al_{0.15}Ga_{0.85}As$ layers. The $Ga_{0.5}In_{0.5}P$ layer 311 has a thickness of $\lambda/4n$ (where $\lambda$ is the laser oscillation wavelength, here, it is 0.85 μm, and n represents the refractive index relative to the oscillation light).

Next, with the well-known photolithography technique, a resist pattern having a circular opening is formed at the center portion of the surface emitting laser device with the diameter of the opening being 12 μm. Then, the p-$Ga_{0.5}In_{0.5}P$ layer 311 is removed by etching using hydrochloric acid-based etchants.

Next, after removing the resist and cleaning the substrate surface, the second crystal growth process is performed, in which a p-$Ga_{0.5}In_{0.5}P$ layer 312 is grown to have a thickness of $\lambda/4n$, and a second upper distributed Bragg reflector 313 is formed from 2.5 pairs of p-$Al_{0.9}Ga_{0.1}As$/$Al_{0.15}Ga_{0.85}As$ layers starting from an $Al_{0.15}Ga_{0.85}As$ layer. Further, on the outermost surface layer of the second upper distributed Bragg reflector 313, a not-illustrated p-GaAs contact layer is provided.

Next, with the well-known photolithography technique, a resist pattern having a circular opening is formed at the center portion of the surface emitting laser device with the diameter of the opening being 10 μm. Then, as shown in FIG. 13, hydrogen ion implantation is performed, a current confinement structure is formed from a high resistance region.

Next, after polishing the back surface of the n-GaAs substrate 301, forming an n-side electrode 318 and a p-side electrode 317, and establishing ohmic-connection between the p-side electrode 317 and the n-side electrode 318, the surface emitting laser device shown in FIG. 13 is formed.

As described above, the distributed Bragg reflector satisfying the phase conditions for multiple-reflection is formed at the position corresponding to the fundamental transverse mode distribution (a region primarily corresponding to the current injection region), while in the region corresponding to the high order transverse mode distribution, the second resonance region 314 is formed, which includes the p-$Ga_{0.5}In_{0.5}P$ layers 311, 312.

In the surface emitting laser device shown in this example, similar to the example 1, due to the resonance action in the second resonance region 314, a large mirror loss is selectively added to the high order transverse mode, and the high order transverse mode oscillation is efficiently suppressed. As a result, it is possible to realize oscillation at high output in the single fundamental transverse mode.

EXAMPLE 4

Figure 14:
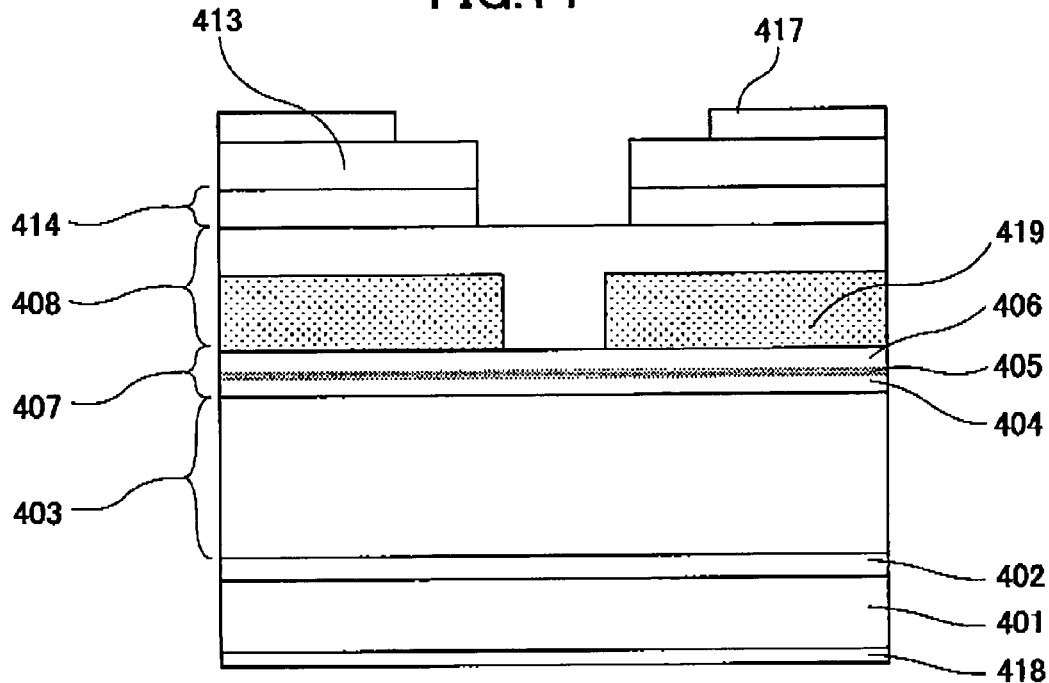
FIG. 14 is a cross-sectional view of a surface emitting laser device according to a fourth example of the present invention.

FIG. 14 is a cross-sectional view of a surface emitting laser device according to a fourth example of the present invention.

Similar to the surface emitting laser device of the example 3 described with reference to FIG. 13, the surface emitting laser device shown in FIG. 14 has an active region formed from a GaAs/$Al_{0.15}Ga_{0.85}As$ multiple quantum well structure and operates at the band of 0.85 μm. However, the surface emitting laser device shown in FIG. 14 differs from that of the example 3 in that it is formed by performing crystal growth process only once. Below, the structure and a fabrication process of the surface emitting laser device shown in FIG. 14 are explained.

When fabricating the surface emitting laser device shown in FIG. 14, a crystal growth-process is performed, in which an n-GaAs buffer layer 402, a 36-pair lower distributed Bragg reflector 403, a one-wavelength resonator 407 including a non-doped $Al_{0.15}Ga_{0.85}As$ spacer layer 404, an active region 405, and a non-doped $Al_{0.15}Ga_{0.85}As$ spacer layer 406, a 23-pair first upper distributed Bragg reflector 408, a second resonance region 414, and a 23-pair second upper distributed Bragg reflector 413 are formed sequentially on an n-GaAs substrate 401.

On the outermost surface of the second upper distributed Bragg reflector 413, a not-illustrated p-GaAs contact layer is provided.

The lower distributed Bragg reflector 403 includes 36 pairs of n-$Al_{0.9}Ga_{0.1}As/Al_{0.15}Ga_{0.85}As$ layers The active region 405 is formed from a GaAs/$Al_{0.15}Ga_{0.85}As$ multiple quantum well structure. The first upper distributed Bragg reflector 408 is formed from 23 pairs of p-$Al_{0.9}Ga_{0.1}As/Al_{0.15}Ga_{0.85}As$ layers. The second upper distributed Bragg reflector 413 is formed from 2.5 pairs of p-$Al_{0.9}Ga_{0.1}As/Al_{0.15}Ga_{0.85}As$ layers starting from an $Al_{0.15}Ga_{0.85}As$ layer.

The second resonance region 414 is formed from a $Ga_{0.5}In_{0.5}P$ layer having a thickness of $\lambda/2n$ (where $\lambda$ is the laser oscillation wavelength, here, it is 0.85 μm, and n represents the refractive index relative to the oscillation light).

Next, with the well-known photolithography technique, a resist pattern having a circular opening is formed at the center of the laser device with the diameter of the opening being 6 μm. Then, with sulfuric acid-based etchants and hydrochloric acid-based etchants, the second upper distributed Bragg reflector 413 and the second resonance region 414 are alternately removed by etching.

Next, with the well-known photolithography technique again, a resist pattern having a circular opening is formed at the center of the laser device with the diameter of the opening being 10 μm. Then, hydrogen ion implantation is performed, and a current confinement structure is formed from a high resistance region 419.

Next, after polishing the back surface of the n-GaAs substrate 401, forming an n-side electrode 418 and a p-side electrode 417, and establishing ohmic-connection between the p-side electrode 417 and the n-side electrode 418, the surface emitting laser device shown in FIG. 14 is formed.

As shown above, the hydrogen ion implantation surface emitting laser device of the present example is formed by performing crystal growth only once, hence, the fabrication process is simple. In addition, in the hydrogen ion implantation surface emitting laser device of the present example, a portion of the second resonance region 414 is arranged within the boundary of the current injection region, which is defined by the hydrogen ion implantation current confinement structure 419, with parts of the second resonance region 414 spatially overlapping with the current injection region 419. Therefore, it is possible to suppress the high order transverse mode oscillation efficiently.

EXAMPLE 5

Figure 15:
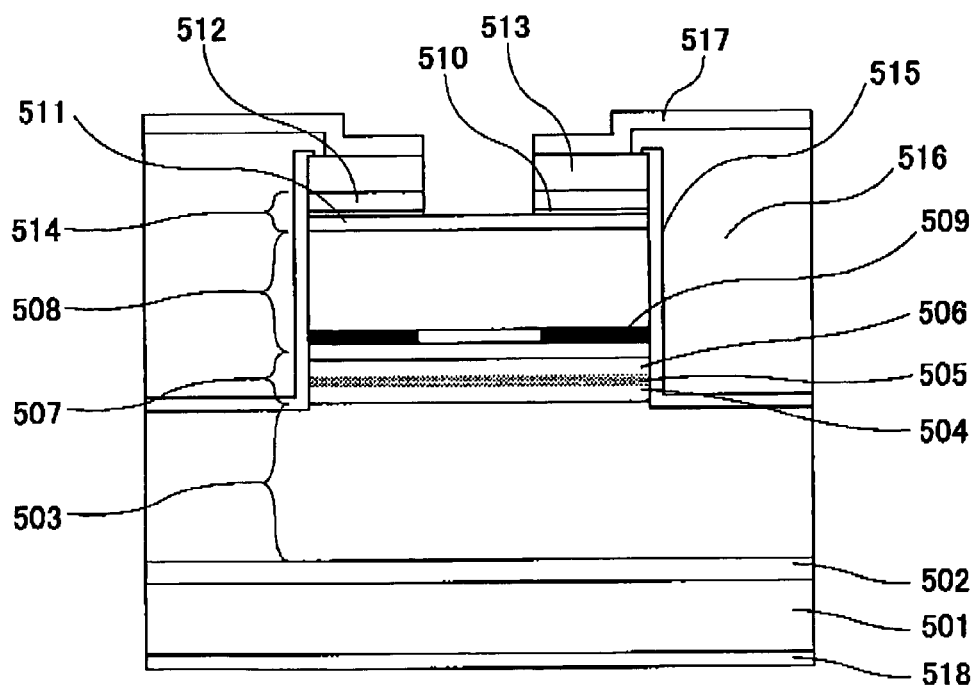
FIG. 15 is a cross-sectional view of a surface emitting laser device according to a fifth example of the present invention.

FIG. 15 is a cross-sectional view of a surface emitting laser device according to a fifth example of the present invention.

The surface emitting laser device shown in FIG. 15 has an active region formed from an AlGaAs/$Al_{0.3}Ga_{0.7}As$ multiple quantum well structure and operates at the band of 0.78 μm, and can be fabricated in the way similar to the example 1. In addition to the difference in the oscillation wavelength, the surface emitting laser device shown in FIG. 15 differs from that of the example 1 in that the second resonance region is formed from a one-wavelength resonator using a high refractive index material able to absorb the laser oscillation light. Below, a fabrication process of the surface emitting laser device shown in FIG. 15 is explained.

When fabricating the surface emitting laser device shown in FIG. 15, a crystal growth process is performed, in which an n-GaAs buffer layer 502, a 36-pair lower distributed Bragg reflector 503, a one-wavelength resonator 507 including a non-doped $Al_{0.3}Ga_{0.7}As$ spacer layer 504, an active region 505, and a non-doped $Al_{0.3}Ga_{0.7}As$ spacer layer 506, a 23.5-pair first upper distributed Bragg reflector 508, a $Al_{0.3}Ga_{0.7}As$ layer 511, a p-$Ga_{0.5}In_{0.5}P$ etching stopping layer 510, a p-GaAs layer 512, and a 2-pair second upper distributed Bragg reflector 513 are formed sequentially on an n-GaAs substrate 501.

The lower distributed Bragg reflector 503 includes 36 pairs of n-$Al_{0.9}Ga_{0.1}As/Al_{0.3}Ga_{0.7}As$ layers. The active region 505 is formed from an AlGaAs/$Al_{0.3}Ga_{0.7}As$ multiple quantum well structure. The first upper distributed Bragg reflector 508 is formed from 23.5 pairs of p-$Al_{0.9}Ga_{0.1}As/Al_{0.3}Ga_{0.7}As$ layers.

The $Al_{0.3}Ga_{0.7}As$ layer 511 has a thickness of $\lambda/4n$ (where $\lambda$ is the laser oscillation wavelength, here, it is 0.78 μm, and n represents the refractive index relative to the oscillation light). The p-GaAs layer 512 has a thickness of $3\lambda/4n$. The second upper distributed Bragg reflector 513 is formed from 2 pairs of p-$Al_{0.9}Ga_{0.1}As/Al_{0.3}Ga_{0.7}As$ layers starting from an $Al_{0.9}Ga_{0.1}As$ layer.

Here, a p-AlAs selective oxidation layer 509 is provided in the first upper distributed Bragg reflector 508.

Further, a not-illustrated GaAs contact layer is provided on the outermost surface layer of the second upper distributed Bragg reflector 513.

Next, with the well-known photolithography technique, a resist pattern having a circular opening is formed at the center portion of the surface emitting laser device. Then, with a well-known etching technique, a circular mesa having a diameter of 25 μm is formed.

Next, in the way same as that of the example 1, selective oxidation of the p-AlAs selective oxidation layer 509 is performed, after that, a $SiO_2$ layer 515 and an insulating resin 516 are formed. Here, for example, the width of the current injection region is 4.5 μm.

Next, with the well-known photolithography technique, a resist pattern having a circular opening is formed at the center of the laser device with the diameter of the opening being 3.5 μm. Then, with the p-$Ga_{0.5}In_{0.5}P$ etching stopping layer 510, the $3\lambda/4n$-thick p-GaAs layer 512 within the resist opening is removed by etching using sulfuric acid-based etchants. Then, the p-$Ga_{0.5}In_{0.5}P$ etching stopping layer 510 is removed by etching using hydrochloric acid-based etchants.

According to the above method, in the etched region at the center of the laser device, which corresponds to the fundamental transverse mode distribution (primarily, the current injection region), the $Al_{0.3}Ga_{0.7}As$ layer 511 having a thickness of $\lambda/4n$ serves as a high refractive index layer satisfying the phase conditions for multiple-reflection in the distributed Bragg reflector. While, in the not-etched region, which corresponds to the high order transverse mode distribution (primarily, region outside the current injection region), the second resonance region 514 is formed from the $Al_{0.3}Ga_{0.7}As$ layer 511 having a thickness of $\lambda/4n$ and the GaAs layer 512 having a thickness of $3\lambda/4n$. In this example, the above structure can be formed by performing crystal growth only once.

Next, a p-side electrode 517 is formed while being aligned to the etched region, an n-side electrode 518 is formed on the back surface by evaporation after polishing the back surface of the n-GaAs substrate 501, and the p-side electrode 517 and the n-side electrode 518 are ohmic-connected. Thereby, the surface emitting laser device shown in FIG. 15 is obtained. In this example, the p-side electrode 517 is arranged to spatially overlap with the second resonance region 514.

In the surface emitting laser device shown in FIG. 15, which has a laser oscillation wavelength of 0.78 μm, the bandgap energy of the p-GaAs layer 512, which is $3\lambda/4n$ thick and acts as a part of the second resonance region 514, is 1.42 eV, it is smaller than the photon energy (1.59 eV) of the laser oscillation light. Due to this, the p-GaAs layer 512 is capable of absorbing the laser oscillation light. In addition, due to the resonance action of the laser oscillation light in the second resonance region 514, the electric field strength increases in the second resonance region 514 compared to the surrounding area. In addition, because strength of the optical absorption action is proportional to the electric field strength, by utilizing the resonance action in the second resonance region 514, it is possible to absorb a large quantity of light.

In addition, in the present example, because the second resonance region 514 has a one-wavelength resonator structure using a high refractive index material, the standing wave induced by the resonance action exhibits the maximum electric field strength at the center of the resonator structure, which corresponds to the position of the p-GaAs layer 512, which is 3λ/4n thick. Hence, the laser oscillation light is strongly absorbed by the p-GaAs layer 512.

As described above, because the second resonance region 514 is able to further add a large absorption loss to the laser oscillation light in addition to the mirror loss. Due to this, the oscillation threshold gain increases for the high order transverse mode laser oscillation through the second resonance region 514, and this efficiently suppresses the high order transverse mode oscillation. In addition, in the surface emitting laser device shown in FIG. 15, because a portion of the second resonance region 514 is arranged within the boundary of the current injection region, which is defined by the selective oxidation structure, with parts of the second resonance region 514 spatially overlapping with the current injection region, it is possible to suppress the high order transverse mode oscillation efficiently, and to obtain stable oscillation at high output in the single fundamental transverse mode. Further, because the current injection region can be made large compared to the related art, it is possible to greatly reduce the resistance of the device.

In this example, the region without the second resonance region 514, that is, the region where the second resonance region 514 is not provided, specifically, the region where the 3λ/4n-thick p-GaAs layer 512 is removed by etching, is made to have a true round shape (an isotropic shape), and is made to have an area smaller than the current injection region. Therefore, the laser beam is shaped by the absorption effect of the second resonance region 514, and the size of the outgoing beam spot is about 3.5 μm and is a true circle.

Because the shape of the region without the second resonance region 514 is determined by the precision of the photolithography process and the etching process, the shape of the current injection region, which is determined by the selective oxidation process, does not depend on the area.

Therefore, the size of the laser beam is of good uniformity inside a wafer, and of high reproducibility between different lots.

In the above, it is described that a light-absorbing material (for example, the p-GaAs layer 512) capable of absorbing the laser oscillation light is provided as a part of the second resonance region 514, but the whole second resonance region 514 can be formed by a light-absorbing material. Further, because strength of the optical absorption action is proportional to the electric field strength, the same light absorption effect can be obtained by arranging the light-absorbing material only in a region corresponding to the anti-node of the electric field standing wave in the second resonance region 514, instead of forming the whole second resonance region 514 from a light-absorbing material.

Here, the light-absorbing material may include a material having lattice strain. For example, in a surface emitting laser device formed on a GaAs substrate, for laser oscillation light having photon energy higher than the bandgap energy of the GaAs substrate, for example, λ of the light is less than 0.87 μm, a GaAs layer can be used as a semiconductor layer for lattice matching. For laser oscillation light having a longer wavelength, in addition to materials enables lattice matching, such a, GaInNAs or the like, materials having lattice strain can be used, such as GaInAs, GaAsSb. Especially, when using materials having lattice strain, since it is possible to prevent degradation of the crystalline property caused by strain relaxation, it is efficient to just provide a light absorbing layer thinner than a critical thickness only at the position corresponding to the anti-node of the electric field standing wave in the second resonance region, where large light absorption effect is obtainable.

In the above, it is described that the substrate is formed from GaAs, but the above description is true even when other substrate materials, such as InP, are used.

EXAMPLE 6

Figure 16:
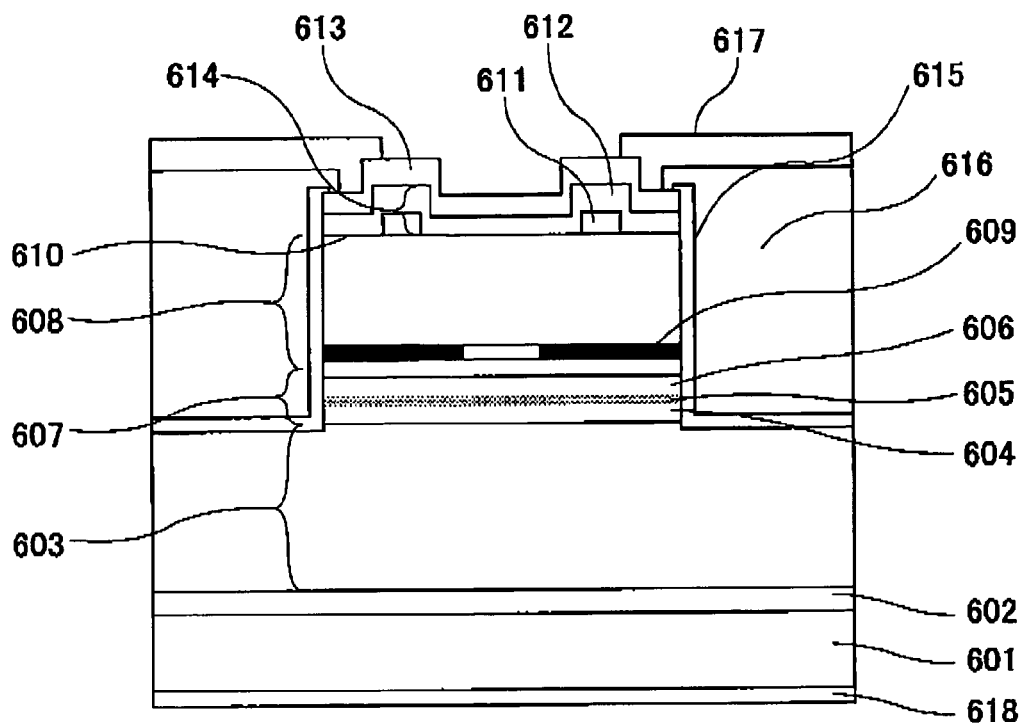
FIG. 16 is a cross-sectional view of a surface emitting laser device according to a sixth example of the present invention.

FIG. 16 is a cross-sectional view of a surface emitting laser device according to a sixth example of the present invention.

The surface emitting laser device shown in FIG. 16 has an active region formed from an AlGaAs/$Al_{0.3}Ga_{0.7}As$ multiple quantum well structure and operates at the band of 0.78 μm, and can be fabricated in the way similar to the example 1. In addition to the difference in the oscillation wavelength, the surface emitting laser device shown in FIG. 16 differs from that of the example 1 in that the region having the second resonance region is formed to be a ring. Below, a fabrication process of the surface emitting laser device shown in FIG. 16 is explained.

When fabricating the surface emitting laser device shown in FIG. 16, a first crystal growth process is performed, in which an n-GaAs buffer layer 602, a 40-pair lower distributed Bragg reflector 603, a one-wavelength resonator 607 including a non-doped $Al_{0.3}Ga_{0.7}As$ spacer layer 604, an active region 605, and a non-doped $Al_{0.3}Ga_{0.7}As$ spacer layer 606, a 23.5-pair first upper distributed Bragg reflector 608, and a p-$Ga_{0.5}In_{0.5}P$ layer 611 are formed sequentially on an n-GaAs substrate 601.

The lower distributed Bragg reflector 603 includes 40 pairs of n-$Al_{0.9}Ga_{0.1}As$/$Al_{0.3}Ga_{0.7}As$ layers The active region 605 is formed from an AlGaAs/$Al_{0.3}Ga_{0.7}As$ multiple quantum well structure. The first upper distributed Bragg reflector 608 is formed from 23.5 pairs of p-$Al_{0.9}Ga_{0.9}As$/$Al_{0.3}Ga_{0.7}As$ layers.

The p-$Ga_{0.5}In_{0.5}P$ layer 611 has a thickness of 3λ/4n (where λ is the laser oscillation wavelength, here, it is 0.78 μm, and n represents the refractive index of GaAs relative to the oscillation light). Here, a p-AlAs selective oxidation layer 609 is provided in the first upper distributed Bragg reflector 608.

Next, with the well-known photolithography technique, a resist pattern having a ring-shaped opening is formed at the center of the laser device having an inner diameter of 6 μm and a width of 2 μm. Then, the 3λ/4n-thick p-$Ga_{0.5}In_{0.5}P$ layer 611 is removed by etching using hydrochloric acid-based etchants but with the portion of the p-$Ga_{0.5}In_{0.5}P$ layer 611 within the resist opening being remained.

Next, after removing the resist and cleaning the substrate surface, a second crystal growth process is performed, in which a p-$Ga_{0.5}In_{0.5}P$ layer 612 is grown to have a thickness of λ/4n, then, a second upper distributed Bragg reflector 613 is formed from two pairs of p-$Al_{0.9}Ga_{0.1}As$/GaAs layers starting from an $Al_{0.9}Ga_{0.1}As$ layer.

Further, a not-illustrated GaAs contact layer is provided on the outermost surface layer of the second upper distributed Bragg reflector 613 to increase the doping concentration near the outermost surface of the second upper distributed Bragg reflector 613.

Next, with the well-known photolithography technique, a resist pattern having a circular opening is formed at the center portion of the surface emitting laser device. Then, with a well-known etching technique, a circular mesa having a diameter of 30 μm is formed. Then, in the way same as that of the example 1, selective oxidation of the p-AlAs selective oxidation layer 609 is performed, after that, a $SiO_2$ layer 615 and an insulating resin 616 are formed. Here, for example, the width of the current injection region is 5 μm.

Next, a p-side electrode 617 and an n-side electrode 518 are formed by evaporation after polishing the back surface of the n-GaAs substrate 601, and the p-side electrode 617 and the n-side electrode 618 are ohmic-connected. Thereby, the surface emitting laser device shown in FIG. 16 is obtained.

In the surface emitting laser device shown in FIG. 16, in the not-etched region, the second resonance region 614 formed from the p-$Ga_{0.5}In_{0.5}P$ layers 611 and 612 is formed, and in the etched region, the second upper distributed Bragg reflector 613 is formed.

In the present example, because the second resonance region 614 is provided in correspondence to the strength distribution of the high order transverse mode, and the ring is arranged only at positions corresponding to large strength.

In the surface emitting laser device shown in FIG. 16, it is possible to obtain oscillation in the single fundamental transverse mode even at high output.

EXAMPLE 7

Figure 17:
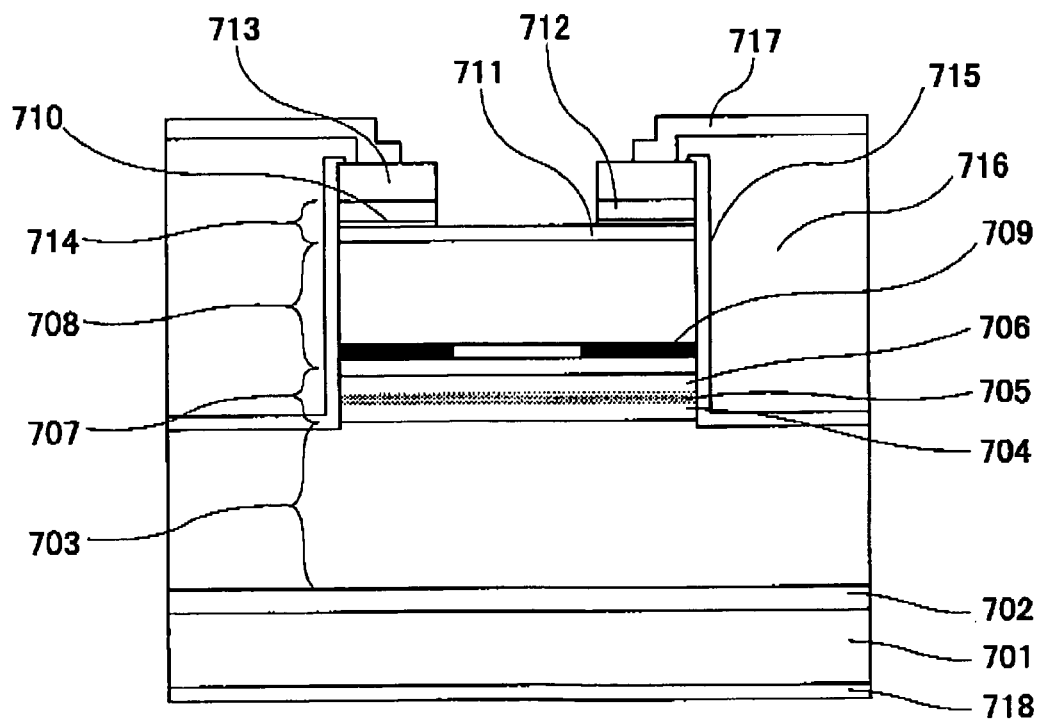
FIG. 17 is a cross-sectional view of a surface emitting laser device according to a seventh example of the present invention.

FIG. 17 is a cross-sectional view of a surface emitting laser device according to a seventh example of the present invention.

The surface emitting laser device shown in FIG. 17 has an active region formed from an AlGaAs/$Al_{0.3}Ga_{0.7}As$ multiple quantum well structure and operates at the band of 0.78 μm. The surface emitting laser device shown in FIG. 17 is basically the same as that of the example 5 and thus can be fabricated in the way similar to the example 5, except that the p-distributed Bragg reflector of the present example is some what different from that in the example 5. Below, a fabrication process of the surface emitting laser device shown in FIG. 17 is explained.

When fabricating the surface emitting laser device shown in FIG. 17, a crystal growth process is performed, in which an n-GaAs buffer layer 702, a 40-pair lower distributed Bragg reflector 703, a one-wavelength resonator 707 including a non-doped $Al_{0.3}Ga_{0.7}As$ spacer layer 704, an active region 705, and a non-doped $Al_{0.3}Ga_{0.7}As$ spacer layer 706, a 23.5-pair first upper distributed Bragg reflector 708, a $Al_{0.3}Ga_{0.7}As$ layer 711, a p-$Ga_{0.5}In_{0.5}P$ etching stopping layer 710, a p-GaAs layer 712, and a 2-pair second upper distributed Bragg reflector 613 are formed sequentially on an n-GaAs substrate 701.

The lower distributed Bragg reflector 703 includes 40 pairs of n-$Al_{0.9}Ga_{0.1}As$/$Al_{0.3}Ga_{0.7}As$ layers The active region 705 is formed from an AlGaAs/$Al_{0.3}Ga_{0.7}As$ multiple quantum well structure. The first upper distributed Bragg reflector 708 is formed from 23.5 pairs of p-$Al_{0.9}Ga_{0.1}As$/$Al_{0.3}Ga_{0.7}As$ layers starting from an $Al_{0.9}Ga_{0.1}As$ layer.

The $Al_{0.3}Ga_{0.7}As$ layer 711 has a thickness of $\lambda/4n$ (where $\lambda$ is the laser oscillation wavelength, here, it is 0.78 μm, and n represents the refractive index relative to the oscillation light). The p-GaAs layer 712 has a thickness of $3\lambda/4n$. The second upper distributed Bragg reflector 713 is formed from 2 pairs of p-$Al_{0.9}Ga_{0.1}As$/$Al_{0.3}Ga_{0.7}As$ layers starting from an $Al_{0.9}Ga_{0.1}As$ layer.

Here, a p-AlAs selective oxidation layer 709 is provided in the first upper distributed Bragg reflector 708.

Further, the $Al_{0.3}Ga_{0.7}As$ layer 711 having a thickness of $\lambda/4n$, the p-$Ga_{0.5}In_{0.5}P$ etching stopping layer 710, and the p-GaAs layer 712 having a thickness of $3\lambda/4n$ serve as a spacer layer constituting the second resonance region 714. In addition, a not-illustrated GaAs contact layer is provided on the outermost surface layer of the second upper distributed Bragg reflector 713.

Next, with the well-known photolithography technique, a resist pattern having a square opening is formed with each side of the opening being 30 μm. Then, with the well-known dry etching technique, layers on the n-$Al_{0.9}Ga_{0.1}As$/$Al_{0.3}Ga_{0.7}As$ lower distributed Bragg reflector 703 are removed by etching to form a square mesa.

After selective oxidation of the p-AlAs selective oxidation layer 709 is performed, a $SiO_2$ layer 715 and an insulating resin 716 are formed. Here, for example, the width of the current injection region is 5 μm.

Next, with the well-known photolithography technique, a resist pattern having an elliptical opening is formed at the center of the mesa with a long axis being 4 μm and a short axis being 3 μm. Then, with the well-known dry etching technique, the layers from the GaAS contact layer on the surface to the middle of the GaAs layer 712 having a thickness of $3\lambda/4n$ are removed by etching. For example, a plasma light emitting monitor is used to confirm etching conditions of the layers.

Then, by wet etching using sulfuric acid-based etchants, the remaining portion of the GaAs layer 712 having a thickness of $3\lambda/4n$ is removed by etching until the p-$Ga_{0.5}In_{0.5}P$ etching stopping layer 710. Then, the p-$Ga_{0.5}In_{0.5}P$ etching stopping layer 710 is removed by etching using hydrochloric acid-based etchants.

Because the dry etching is performed when a large amount of material it to be removed at one time, the side surface being etched can be made sharp. Further, because the wet etching is performed to remove the residual films, a high etching precision in the depth direction is obtainable.

It should be noted that other etching techniques could be used in addition to the above methods. For example, layers on the p-$Ga_{0.5}In_{0.5}P$ etching stopping layer 710 can be removed at one time by performing the wet etching only once using sulfuric acid-based etchants.

Next, a p-side electrode 717 and an n-side electrode 718 are formed by evaporation, and are ohmic-connected, forming the surface emitting laser device shown in FIG. 17.

As shown above, in the present example, since the surface emitting laser device is formed by performing crystal growth only once, the fabrication process is simple.

In the present example, a portion of the second resonance region 714 is formed by GaAs, and is able to absorb the laser oscillation light (0.78 μm). Therefore, similar to the example 5, the second resonance region 714 is able to add absorption loss to the high order transverse mode light in addition to the mirror loss. Thus, it is possible to suppress the high order transverse mode oscillation efficiently, and to obtain stable oscillation at high output in the single fundamental transverse mode.

In addition, by processing the region without the second resonance region 714 to be an elliptical shape, an outgoing beam having an elliptical shape can be obtained. That is, any desired beam shape can be obtained in response to the shape of the region without the second resonance region 714.

In the above examples, it is described that the second resonance region is provided on the distributed Bragg reflector on the light-emitting side (that is, in the upper distributed Bragg reflector), but the second resonance region may also be provided on the distributed Bragg reflector on the substrate side (that is, in the lower distributed Bragg reflector), or be provided in either of the lower distributed Bragg reflector or the upper distributed Bragg reflector, and the same effect can be obtained.

As for the substrate, in addition to an n-type substrate, a semiconductor substrate, or a p-type substrate may also be used, and in addition to GaAs, the substrate may also be formed from InP.

In the above, it is described that the crystal growth is performed by MOCVD (Metal-Organic CVD), of course, other methods may be used, such as MBE (Molecular Beam Epitaxy).

In addition, the laser oscillation wavelength is not limited to 0.78 µm, 0.85 µm, 0.98 µm, and 1.3 µm, but can be other values such as 0.65 µm, or 1.3 µm. In this case, the semiconductor materials are not limited to the above examples, either, but use can be made of any other semiconductor materials in accordance with the laser oscillation wavelength. For example, at the band of 0.65 µm, an AlGaInP-based mixed crystal semiconductor material may be used, and at the band of 1.5 µm, a GaInNAs(Sb)-based mixed crystal semiconductor material may be used, By selecting the material and structure of the distributed Bragg reflector appropriately in accordance with the laser oscillation wavelength, it is possible to form a surface emitting laser device with any kind of structure and able to emit light of any oscillation wavelength. Specifically, it is preferable that the material is transparent relative to the laser oscillation light of the surface emitting laser device, and has a large refractive index. Further, the structure of the surface emitting laser device is not limited to the above ones, and the surface emitting laser devices described in the above examples can have other oscillation wavelengths.

In order to further reduce the resistance of the laser device, it is effective to provide a hetero spike buffer layer on the hetero interface of each layer included in the distributed Bragg reflector formed from Al(Ga)As/GaAs or the like, with the hetero spike buffer layer having compositions between the layers. In addition, a hetero spike buffer layer may also be provided on the interface of the selective oxidation layer or the like.

The hetero spike buffer layer may be a single layer having compositions between the layers constituting the hetero interface, or a combination of plural layers having different compositions, or a layers having a composition distribution.

EXAMPLE 8

Figure 18:
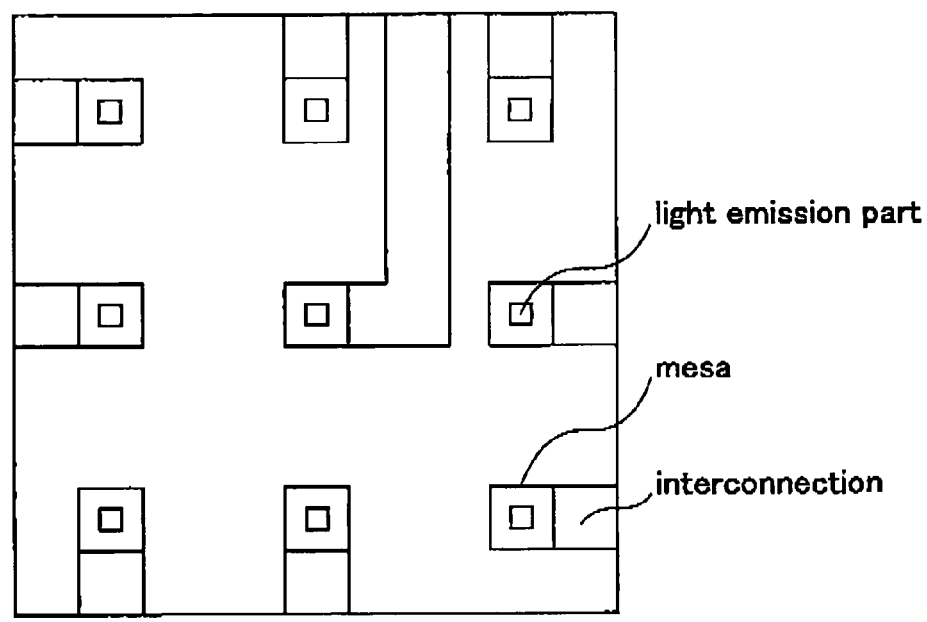
FIG. 18 is a schematic diagram illustrating a surface emitting laser array according to an eighth example of the present invention.

FIG. 18 is a block view schematically illustrating a surface emitting laser array according to an eighth example of the present invention.

Specifically, FIG. 18 is a top view of a monolithic laser array including 4×4 surface emitting laser devices of the present invention arranged in a two-dimensional manner.

As illustrated in FIG. 18, in order to drive each surface emitting laser device independently, an interconnection is provided on an upper electrode. The surface emitting laser array in FIG. 18 is formed in the way as described in the above examples. In each of the surface emitting laser devices included in the array, a second resonance region is provided in an area at the middle of a distributed Bragg reflector corresponding to the high order transverse modes, due to the resonance action in the second resonance region, it is possible to increase mirror loss (that is, increase of transmitting light) for the high order transverse mode oscillation, and increase absorption loss for the high order transverse mode oscillation. As a result, it is possible to efficiently suppress the high order transverse mode oscillation, thus obtaining a surface emitting laser device capable of oscillation at high output in the single fundamental transverse mode. When selective oxidation surface emitting laser devices are used, because the high order transverse mode oscillation is efficiently suppressed due to the second resonance region, it is not necessary to set the current injection region defined by the selective oxidation structure to be small, as in the related art. Hence, the resistance of the laser device is low, and a saturation level associated with heat generation is high. As a result, the surface emitting laser array in FIG. 18 is capable of oscillation at high output in the single fundamental transverse mode.

EXAMPLE 9

Figure 19:
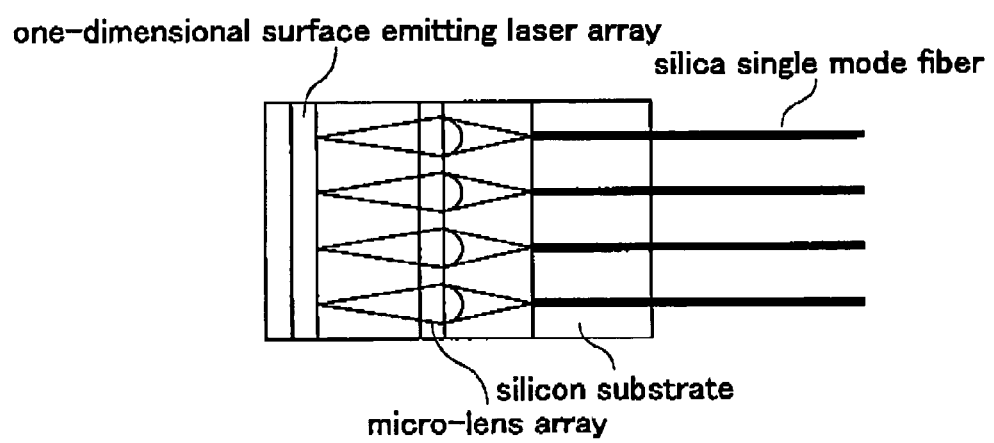
FIG. 19 is a schematic diagram illustrating a surface emitting laser module according to a ninth example of the present invention.

FIG. 19 is a block view schematically illustrating a surface emitting laser module according to a ninth example of the present invention.

Specifically, in the surface emitting laser module shown in FIG. 18, a one-dimensional monolithic surface emitting laser array, a micro-lens, and a fiber array are mounted on a silicon substrate.

The one-dimensional monolithic surface emitting laser array is arranged to face the fiber array, and is coupled to the fiber array through the micro-lens, which is formed from silica single mode fibers arranged in V-shaped grooves on the silicon substrate.

The oscillation wavelength of the surface emitting laser array is 1.3 µm, and by using the silica single mode fiber, it is possible to perform high speed transmission.

Because the surface emitting laser module of the present example uses the surface emitting laser array described above, the surface emitting laser module is capable of stable oscillation at high output in the fundamental transverse mode. Therefore, it is possible to provide a surface emitting laser module of high reliability and involving little change in coupling with the optical fiber even when driving conditions, such as environment temperature or the like, change.

EXAMPLE 10

Figure 20:
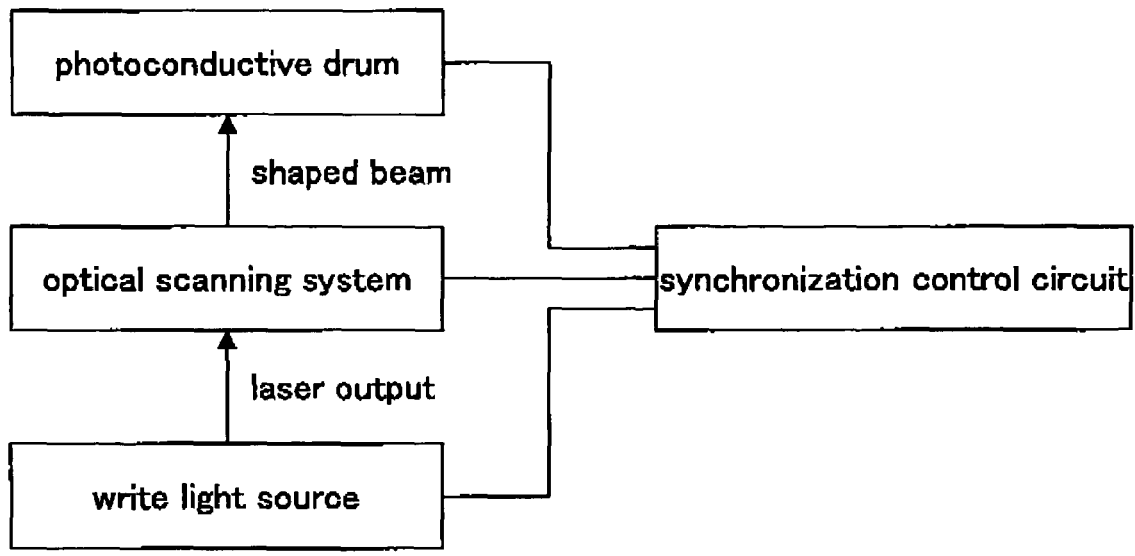
FIG. 20 is a block diagram schematically illustrating an electrophotographic system according to a 10th example of the present invention.

FIG. 20 is a block view schematically illustrating an electrophotographic system according to a 10th example of the present invention.

The electrophotographic system in FIG. 20 includes a photoconductive drum, an optical scanning system (scanning and convergence optical system), a write light source, and a synchronization control circuit (synchronization controller). The write light source uses the surface emitting laser device or the surface emitting laser array of the present invention.

In the electrophotographic system in FIG. 20, being controlled by the synchronization control circuit, a light beam from the write light source (surface emitting laser device) is processed by the scanning and convergence optical system, which includes a polygon mirror and a lens convergence system, and is condensed on the photoconductive drum, forming a latent image thereon.

Since the surface emitting laser device or the surface emitting laser array of the present invention is capable of operation at high output in a single fundamental transverse mode, the electrophotographic system using the surface emitting laser device or the surface emitting laser array is capable of high speed write operation. Further, because the far-field image is of a single-peak pattern, it is easy to condense the light beam and obtain an image of high resolution.

A red surface emitting laser device having an active region formed from AlGaInP-based materials has an oscillation wavelength of 0.65 μm, which is short compared to a surface emitting laser device having an active region formed from AlGaAs-based materials. Due to this, there is a large margin for optical design. Hence, it is preferable to use the red surface emitting laser device of the present invention as a write light source in a high resolution electrophotographic system. Such a red surface emitting laser device of the present invention can be constructed by using AlGaInP-based materials for the active layer, and AlGaAs-based materials or AlGaInP-based materials for the distributed Bragg reflector. Because these materials can be formed by crystal growth on a GaAs substrate under the condition of lattice matching, the AlAs material can be used for a selective oxidation layer.

Since the AlGaInP-based materials are liable to be influenced by a temperature change, when the temperature rises due to heat generation in the laser device, output saturation or oscillation termination occurs.

However, in the red surface emitting laser device of the present invention, the high order transverse mode oscillation is efficiently suppressed due to the resonance action in the second resonance region, it is possible to obtain oscillation at high output in the single fundamental transverse mode without increasing the resistance of the laser device.

According to the present example, the surface emitting laser device or the surface emitting laser array of the present invention are preferable for being used as a write light source in an electrophotographic system.

EXAMPLE 11

Figure 21:
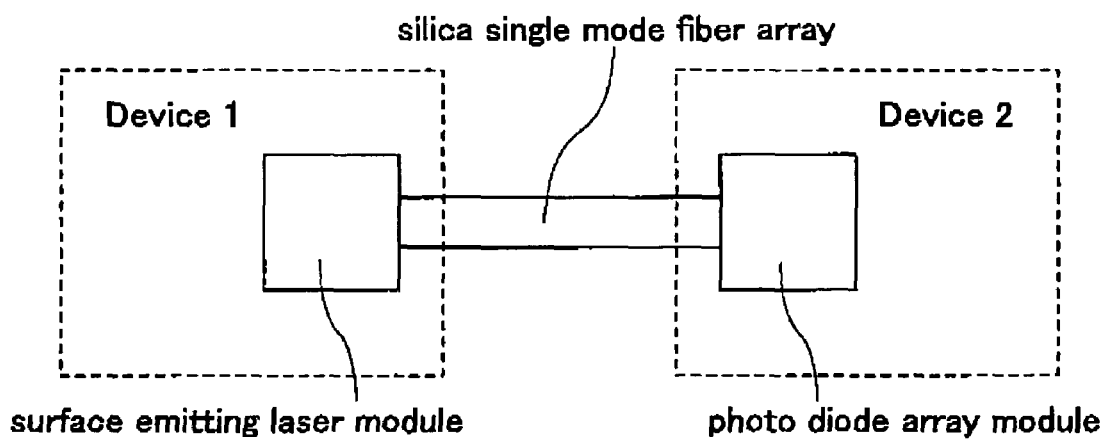
FIG. 21 is a schematic diagram illustrating an optical interconnection system according to an 11th example of the present invention.

FIG. 21 is a block view schematically illustrating an the optical interconnection system according to an 11th example of the present invention.

In the optical interconnection system shown in FIG. 21, a device 1 and a device 2 are connected via optical fibers. The device 1, which is on the side of a transmitter, includes a one-dimensional laser array module using the surface emitting laser device or the surface emitting laser array of the present invention, and driving circuits for the surface emitting laser devices. The device 2, which is on the side of a receiver, includes a photo diode array module, and a signal detection circuit.

Because the optical interconnection system of the present example uses the surface emitting laser or the surface emitting laser array of the present invention, the optical interconnection system of the present example is capable of stable oscillation at high output in the fundamental transverse mode. Therefore, it is possible to provide an optical interconnection system of high reliability and involving little change in coupling with the optical fiber even when driving conditions, such as environment temperature or the like, change.

In this example, a parallel optical interconnection system is described as an example, the present invention is also applicable to a serial optical interconnection system using a single element. Further, in addition to different devices, the optical interconnection system can also be used between different boards, chips, or inside chips.

While the present invention is described above with reference to specific embodiments chosen for purpose of illustration, it should be apparent that the invention is not limited to these embodiments, but numerous modifications could be made thereto by those skilled in the art without departing from the basic concept and scope of the invention.

This patent application is based on Japanese Priority Patent Applications No. 2004-299069 filed on Oct. 13, 2004 and No. 2005-271375 filed on Sep. 20, 2005, and the entire contents of which are hereby incorporated by reference.

What is claimed is:

1. A surface emitting laser device, comprising:
 a first resonance region that includes an active layer and spacer layers provided on two sides of the active layer;
 two distributed Bragg reflectors that sandwich the first resonance region and face each other, each of the distributed Bragg reflectors including periodically stacked low refractive index layers and high refractive index layers; and
 a current confinement structure that defines a current injection region for injecting a current into the active layer;
 wherein at least one of the distributed Bragg reflectors includes a second resonance region, wherein the second resonance region includes an opening therein, the opening being arranged such that it includes a center of the current injection region and extends toward an inner boundary of the current injection region, and wherein there is no resonance in the opening.

2. The surface emitting laser device as claimed in claim 1, wherein
 at least a part of the opening within the second resonance region is within the inner boundary of the current injection region; and
 the second resonance region at least partially spatially overlaps with the current injection region.

3. The surface emitting laser device as claimed in claim 1, wherein the opening within the second resonance region extends further than the inner boundary of the current injection region.

4. The surface emitting laser device as claimed in claim 1, wherein
 the second resonance region includes a spacer layer having a refractive index higher than the refractive index of the low refractive index layers in the distributed Bragg reflectors; and
 the spacer layer in the second resonance region has a thickness equaling m/2n of a laser oscillation wavelength, where m is an integer and n is the refractive index of the spacer layer in the second resonance region.

5. The surface emitting laser device as claimed in claim 1, wherein
 the second resonance region includes a spacer layer having a refractive index lower than the refractive index of the high refractive index layers in the distributed Bragg reflectors; and
 the spacer layer in the second resonance region has a thickness equaling m/2n of a laser oscillation wavelength, where m is an integer and n is the refractive index of the spacer layer in the second resonance region.

6. The surface emitting laser device as claimed in claim 1, wherein the current confinement structure includes a semiconductor layer selective oxidation structure including aluminum.

7. The surface emitting laser device as claimed in claim 1, wherein the current confinement structure includes a high resistance region formed by ion implantation.

8. The surface emitting laser device as claimed in claim 1, wherein one or more layers of the second resonance region include a semiconductor material capable of absorbing laser oscillation light.

9. The surface emitting laser device as claimed in claim 1, wherein a semiconductor layer capable of absorbing laser oscillation light is provided at a position corresponding to an anti-node of an electric field standing wave in the second resonance region.

10. The surface emitting laser device as claimed in claim 9, wherein the semiconductor layer includes a material having lattice strain.

11. The surface emitting laser device as claimed in claim 8, wherein the inner boundary of the current injection region has a shape different from a shape of the opening within the second resonance region; and
the shape of the opening within the second resonance region is isotropic.

12. The surface emitting laser device as claimed in claim 1, wherein
the surface emitting laser device is configured to emit a laser beam from a light-emitting side opposite to a substrate thereof; and
an electrode is provided on a surface of one of the distributed Bragg reflectors on the light-emitting side, said electrode having an opening within a boundary of a region occupied by the second resonance region.

13. The surface emitting laser device as claimed in claim 1, wherein
the surface emitting laser device is configured to emit a laser beam from a light-emitting side opposite to a substrate thereof; and
an electrode is provided on a surface of one of the distributed Bragg reflectors on the light-emitting side, said electrode having an opening corresponding to a portion of the second resonance region on a side of a center of the surface emitting laser device.

14. The surface emitting laser device as claimed in claim 1, wherein a position of the second resonance region is in a range from a position corresponding to approximately half of a number of pairs in one of the distributed Bragg reflectors including the second resonance region to a position on a side opposite to the active layer.

15. The surface emitting laser device as claimed in claim 1, wherein more than one of the second resonance regions are provided.

16. The surface emitting laser device as claimed in claim 1, wherein the active layer is formed from a III-V semiconductor material and has an oscillation wavelength longer than 1.1 µm, wherein the III element includes at least one of Ga and In, and the V element includes at least one of As, P, N, and Sb.

17. The surface emitting laser device as claimed in claim 1, wherein the active layer is formed from a III-V semiconductor material and has an oscillation wavelength shorter than 1.1 µm, wherein the III element includes at least one of Al, Ga, and In, and the V element includes at least one of As and P.

18. The surface emitting laser device as claimed in claim 1, wherein the opening within the second resonance region extends within a distance from the center of the current injection region, said distance being in a range from 0.5 µm to 2 µm.

19. A surface emitting laser array, comprising:
a plurality of surface emitting laser devices,
wherein
each of the surface emitting laser devices includes:
a first resonance region that includes an active layer and spacer layers provided on two sides of the active layer;
two distributed Bragg reflectors that sandwich the first resonance region and face each other, each of the distributed Bragg reflectors including periodically stacked low refractive index layers and high refractive index layers; and
a current confinement structure that defines a current injection region for injecting a current into the active layer;
wherein at least one of the distributed Bragg reflectors includes a second resonance region, wherein the second resonance region includes an opening therein, the opening being arranged such that it includes a center of the current injection region and extends toward an inner boundary of the current injection region, and wherein there is no resonance in the opening.

20. A surface emitting laser module, comprising:
a surface emitting laser device;
wherein
the surface emitting laser device includes:
a first resonance region that includes an active layer and spacer layers provided on two sides of the active layer;
two distributed Bragg reflectors that sandwich the resonance region and face each other, each of the distributed Bragg reflectors including periodically stacked low refractive index layers and high refractive index layers; and
a current confinement structure that defines a current injection region for injecting a current into the active layer;
wherein at least one of the distributed Bragg reflectors includes a second resonance region, wherein the second resonance region includes an opening therein, the opening being arranged such that it includes a center of the current injection region and extends toward an inner boundary of the current injection region, and wherein there is no resonance in the opening.

21. An electrophotographic system, comprising:
a surface emitting laser device;
wherein
the surface emitting laser device includes:
a first resonance region that includes an active layer and spacer layers provided on two sides of the active layer;
two distributed Bragg reflectors that sandwich the resonance region and face each other, each of the distributed Bragg reflector including periodically stacked low refractive index layers and high refractive index layers; and
a current confinement structure that defines a current injection region for injecting a current into the active layer;
wherein at least one of the distributed Bragg reflectors includes a second resonance region, wherein the second resonance region includes an opening therein, the opening being arranged such that it includes a center of the current injection region and extends toward an inner boundary of the current injection region, and wherein there is no resonance in the opening.

22. An optical communication system, comprising:
a surface emitting laser device;
wherein
the surface emitting laser device includes:
a first resonance region that includes an active layer and spacer layers provided on two sides of the active layer;
two distributed Bragg reflectors that sandwich the resonance region and face each other, each of the distributed Bragg reflectors including periodically stacked low refractive index layers and high refractive index layers; and
a current confinement structure that defines a current injection region for injecting a current into the active layer;
wherein at least one of the distributed Bragg reflectors includes a second resonance region, wherein the second resonance region includes an opening therein, the opening being arranged such that it includes a center of the current injection region and extends toward an inner boundary of the current injection region, and wherein there is no resonance in the opening.

23. An optical interconnection system, comprising:
a surface emitting laser device;
wherein
the surface emitting laser device includes:
a first resonance region that includes an active layer and spacer layers provided on two sides of the active layer;
two distributed Bragg reflectors that sandwich the resonance region and face each other, each of the distributed Bragg reflectors including periodically stacked low refractive index layers and high refractive index layers; and
a current confinement structure that defines a current injection region for injecting a current into the active layer;
wherein at least one of the distributed Bragg reflectors includes a second resonance region, wherein the second resonance region includes an opening therein, the opening being arranged such that it includes a center of the current injection region and extends toward an inner boundary of the current injection region, and wherein there is no resonance in the opening.

* * * * *